United States Patent [19]
Kurle et al.

[11] Patent Number: 6,137,261
[45] Date of Patent: *Oct. 24, 2000

[54] RECHARGEABLE BATTERY MAINTENANCE AND TESTING SYSTEM

[75] Inventors: Wayne D. Kurle, Winston, Ga.; Stephen B. Johnson, Clinton, Wash.; Rockland W. Nordness, Kirkland, Wash.; Stephen L. Firman, Woodinville, Wash.; Douglas M. Gustavson, Guilford, Conn.

[73] Assignee: Physio-Control Manufacturing Corporation, Redmond, Wash.

[ * ] Notice: This patent issued on a continued prosecution application filed under 37 CFR 1.53(d), and is subject to the twenty year patent term provisions of 35 U.S.C. 154(a)(2).

[21] Appl. No.: 09/013,409

[22] Filed: Jan. 26, 1998

[51] Int. Cl.$^7$ ........................................................ H02J 7/00
[52] U.S. Cl. ............................ 320/132; 320/131; 320/150
[58] Field of Search ....................... 320/137, 128, 320/132, 134, 135, 136, 131, 130, 150

[56] References Cited

U.S. PATENT DOCUMENTS

| | | | |
|---|---|---|---|
| 4,709,202 | 11/1987 | Koenck et al. | 320/112 |
| 4,800,336 | 1/1989 | Mikami et al. | |
| 4,885,523 | 12/1989 | Koenck . | |
| 5,130,659 | 7/1992 | Sloan . | |
| 5,455,499 | 10/1995 | Uskali et al. | |
| 5,625,291 | 4/1997 | Brink et al. | |
| 5,633,573 | 5/1997 | Van Phouc et al. | 320/128 |
| 5,721,482 | 2/1998 | Benvegar et al. | |
| 5,789,899 | 8/1998 | Van Phouc et al. | 320/112 |
| 5,850,134 | 12/1998 | Oh et al. | 320/106 |
| 5,951,229 | 9/1999 | Hammerslag | 414/398 |

FOREIGN PATENT DOCUMENTS

| | | |
|---|---|---|
| 0 743 531A2 | 11/1996 | European Pat. Off. . |
| 0 743 532A2 | 11/1996 | European Pat. Off. . |
| 0 743 533A2 | 11/1996 | European Pat. Off. . |
| 9-271144 | 10/1997 | Japan .............................. H02J 7/00 |

OTHER PUBLICATIONS

"System Management Bus Specification," *Smart Battery System Specifications*, Revision 1.0, Feb. 15, 1995. Benchmarq Microelectronics, Inc. et al., 1996.

"System Management Bus Specification," *Smart Battery System Specifications*, Revision 1.0, Jun. 27, 1996. Benchmarq Microelectronics, Inc. et al., 1996.

*Primary Examiner*—Peter S. Wong
*Assistant Examiner*—Gregory J. Toatley, Jr.
*Attorney, Agent, or Firm*—Christensen O'Connor Johnson & Kindness PLLC

[57] ABSTRACT

A battery maintenance and testing system (22) that includes a battery support system (2) that tests, conditions, and charges rechargeable battery packs. The battery support system (22) accommodates a dumb battery (32) that do not have any internal logic by running a default maintenance routine, as well as a smart battery (24, 24') that has internal logic that monitors its condition, keeps track of the time and number of charge discharge cycles the battery has experienced since it was last conditioned, logs any errors that would necessitate the battery being discarded, and stores information relevant to its maintenance and testing. The battery maintenance and testing system (22) is able to communicate with a smart battery (24, 24') to automatically to retrieve this information and use it to condition, test, and charge the battery to optimal condition or to indicate to the user that the battery is defective and needs to be discarded. A user display and interface (43) is also provided on the battery support system that allows the user to manually charge, condition, or test a rechargeable battery pack.

81 Claims, 14 Drawing Sheets

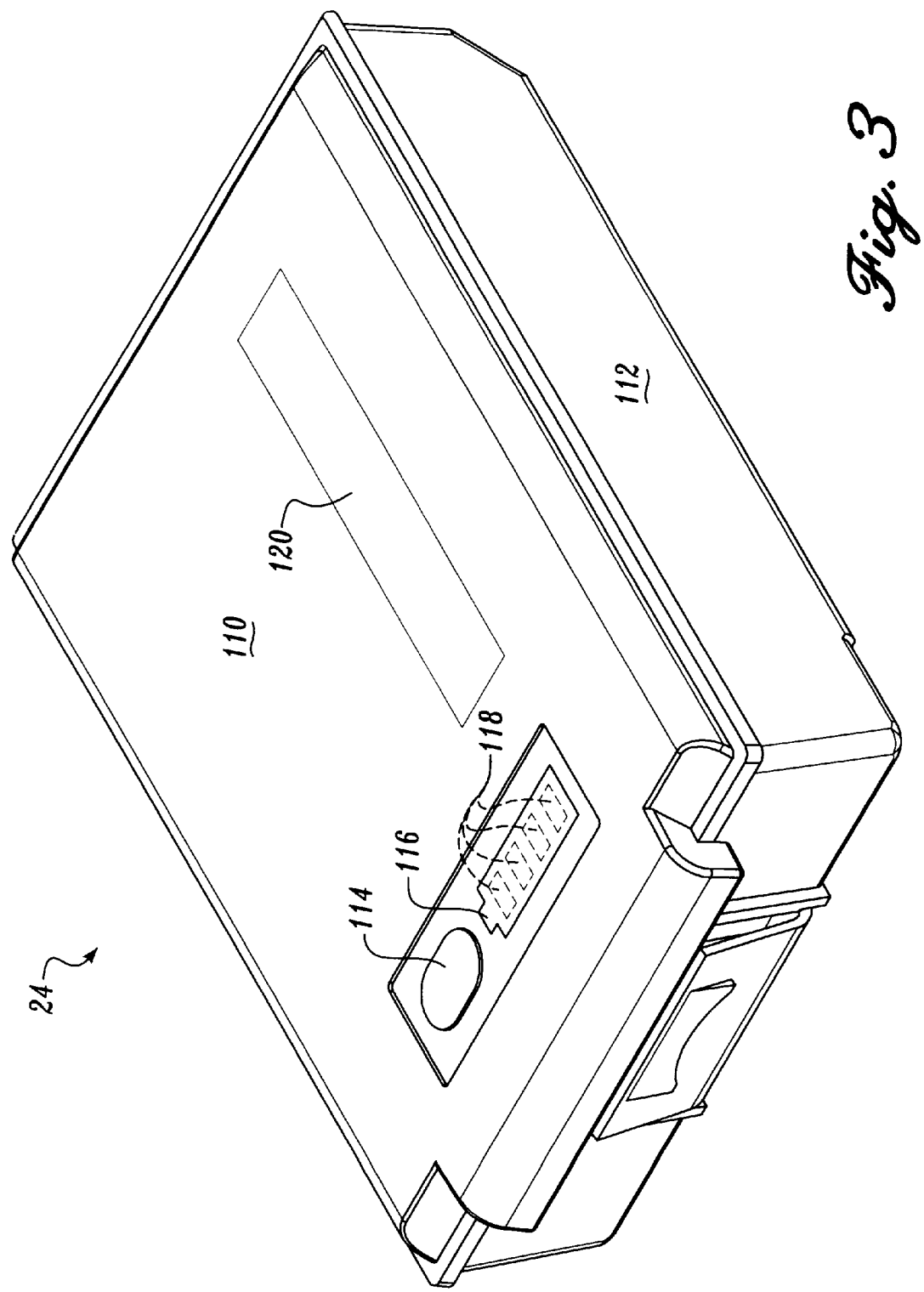

RECHARGEABLE BATTERY MAINTENANCE AND TESTING SYSTEM

FIELD OF THE INVENTION

The present invention relates generally to the field of rechargeable batteries, and more particularly to a rechargeable battery maintenance and testing system that reconditions, tests, and charges rechargeable battery packs intended for use with portable cardiac defibrillators where it is critical that the rechargeable battery packs be optimally maintained and operate with verified reliability.

BACKGROUND OF THE INVENTION

With the proliferation of portable electronic devices, the use of rechargeable batteries has become increasingly important. Rechargeable batteries can now be found in devices as simple as a flashlight, as important as notebook computers, and as vital as portable medical equipment. An example of a portable medical device which is dependent on a rechargeable battery pack is a portable defibrillator unit.

Portable defibrillator units are used by emergency medical technicians and others on persons suffering from certain types of abnormal heart rhythms, e.g., ventricular fibrillation, to shock the heart back into a normal beating pattern. Although many of these portable defibrillators have the ability to operate off of AC line current, when used in the field, portable defibrillators are almost totally dependent on rechargeable battery packs. The portable battery packs provide the power both to operate the internal electronics of the defibrillator and to provide the charge source for the therapeutic shock. In order to provide the power source for charging the shock delivery portion of the defibrillator, it is necessary that the portable battery pack be capable of providing a relatively large current draw over a relatively short period of time. If the battery is unable to supply this current when demanded, the delivery of a therapeutic shock may be delayed or prohibited. Therefore, it is important to maintain a state of charge in a portable battery pack that is sufficient to deliver therapeutic shocks.

Seconds count in the application of the therapeutic shock to a person suffering a heart attack. Swapping a bad battery pack in and out of a defibrillator may waste this precious time, as may waiting for a marginally functional battery to deliver the charge necessary for the therapeutic shock. It is important, therefore, for the user of a portable defibrillator to make sure that a reliable, working battery pack is available. This has usually meant having an ample supply of extra battery packs available. Unfortunately, one can usually only guess the ability of the battery pack to reliably deliver high current charging pulses. While users normally log the age and use of the battery manually to predict its current condition, the accuracy of the predictions are both dependent on the accuracy of the records and the validity of the underlying assumptions of the predictions. Therefore, it is important to provide regular, reliable maintenance and testing of portable battery packs.

In response to the demand for batteries that provide a means to determine their state of charge, computer and battery manufacturers have been recently developing "smart batteries," which internally measure battery variables such as voltage and current flow in and out of the battery and then apply predictive algorithms to estimate the battery's state of charge. The battery's predicted state of charge can then be communicated to a portable electronic device such as a notebook computer (a "host") over a communication bus. This is useful in applications where a computer needs to find out if there is enough charge left in the battery to save a word-processing file to a disk drive. However, the prediction of a smart battery's state of charge must be much more reliable in medical device equipment, such as a defibrillator, where the battery's actual ability to deliver charge is crucial to the appropriate treatment of an individual. This is particularly true if the only way to determine if the battery is able to deliver the charge is by first inserting it into the host unit. This again demonstrates the need for reliable maintenance and testing.

However, there is more to the maintenance of a rechargeable battery pack than just charging it. These additional maintenance steps are often specific to the battery chemistry. Rechargeable battery packs are currently manufactured using a number of known battery chemistries, including nickel cadmium (NiCd), sealed lead acid (SLA), nickel-metal hydride (NiMH), lithium ion (Li-ion), lithium polymer (Li-polymer), and rechargeable alkaline. The most popular choice for rechargeable batteries is currently the NiCd chemistry because it is relatively inexpensive, is fast and easy to charge, has excellent load performance even at cold temperatures, and is capable of withstanding a high number of charge/discharge cycles. Over the course of the life of the NiCd battery, however, the cycling of the battery causes it to develop crystalline formations which substantially decreases the battery's ability to hold charge. This decrease is commonly referred to as "memory." It is known that NiCd memory can be substantially reduced by "conditioning" the battery, which involves fully discharging the battery and then charging the battery back to the state of full charge. This process breaks down the crystalline structure developed over time and enables the battery to receive and store a greater charge.

If the NiCd "memory" goes undetected, it may show a voltage indicating a full charge while it actually does not hold sufficient charge to supply the high current pulse required by a demanding application such as a portable defibrillator. While this "memory" problem has long been recognized, the conditioning required to correct it has depended on the user manually conditioning the battery on a regular basis. This meant that the user had to estimate when the battery required conditioning and then manually put the battery through a conditioning process. The actual discharge and charging of the battery during conditioning can take hours during which the battery is out of service. Consequently, rechargeable battery packs are sometimes used past the period in which they should be reconditioned, used until they fail, or are simply discarded much earlier than they would actually need to be if they were properly maintained.

Another cause of battery failure is that rechargeable batteries experience self-discharge. The amount of this self-discharge varies according to battery chemistry, age, or the presence of manufacturing defects. For instance, according to one source, the NiCd loses about 10% of its capacity within the first 24 hours, after which the self-discharge settles to about 10% per month. The rate of this self-discharge generally increases as the battery ages. Therefore, the battery is constantly losing power whether it is being used or not. If the self-discharge becomes excessive, it may quickly lose its ability to reliably deliver its charge while sitting on the shelf waiting for use.

Accordingly, a method and apparatus for reliably maintaining and testing a portable battery pack are needed. The method and apparatus should accurately and consistently predict the state of charge of the portable battery. Further, the method and apparatus should automatically and efficiently recondition the battery, based on the battery's chemistry, as soon as the need for conditioning is detected. The method and apparatus should also be able to measure the self-discharge of a battery being tested. As explained in the following, the present invention provides a method and apparatus that meets these criteria and solves other problems in the prior art.

SUMMARY OF THE INVENTION

In accordance with the present invention, a battery maintenance and testing system is provided, which maintains rechargeable battery packs by conditioning, testing and charging them. The rechargeable battery packs can either be "smart batteries" that have the ability to communicate with the rechargeable battery maintenance and testing system over a bidirectional communication bus or "dumb batteries" that have no such communication ability. Logic and memory circuits internal to the smart battery continuously monitor and record the battery's ability to deliver charge to the portable defibrillator unit, the battery's rate of self-discharge, the amount of time that has expired since the battery was last reconditioned, the number of cycles since the battery was last reconditioned, and the amount of time that the battery has operated in a temperature range that exceeds a recommended maximum temperature. The smart battery also stores identification information about the battery's type and charge characteristics that are relevant to the choice of charging and conditioning algorithms. This information is assembled and transmitted to the battery maintenance and testing system which uses the information to automatically maintain and test the battery.

In accordance with one aspect of the present invention, the battery maintenance and charging system communicates with the smart battery over a bi-directional communication bus and determines if the smart battery requires conditioning. If the rechargeable battery maintenance and testing system determines that the battery requires conditioning, the system enters into a conditioning mode without user intervention.

The particular conditioning algorithm used by the rechargeable battery maintenance and testing system is determined by retrieving charging, conditioning, and testing parameters from the smart battery over the bidirectional communication bus. The conditioning mode includes a pulse discharge test which periodically stresses the battery by drawing a large current, short duration, pulse from the battery while measuring the actual charge delivered and the battery's voltage under load. If the charge delivered does not equal or exceed a predetermined total charge, or the battery voltage ever drops below a predetermined minimum voltage threshold, the rechargeable battery maintenance and testing system transitions to a discard mode which indicates that the battery is no longer reliable and should be discarded.

Once the smart battery is reconditioned and it has passed the pulse discharge test, the rechargeable battery maintenance and testing system moves to a charging mode that is also based on the battery's chemistry, which has been determined by communicating with the smart battery. If the charging mode is successful, the rechargeable battery maintenance and testing system moves to a ready mode in which the battery is kept in optimal condition until it is removed from the rechargeable battery maintenance and testing system. The ready mode stores the battery and maintains it in optimum working condition by providing a trickle or float charge. The time that the battery remains in the rechargeable battery maintenance and testing system is also monitored. Depending on the battery type, which has been previously ascertained by retrieving the battery parameters from the battery itself, the rechargeable battery maintenance and testing system cycles the battery as appropriate to its chemistry. The smart battery, therefore, is continuously maintained in its optimum operating condition by the rechargeable battery maintenance and testing system.

In accordance with another aspect of the present invention, the rechargeable battery maintenance and testing system is backward compatible for use with batteries not having the embedded intelligence of the smart batteries. If the rechargeable battery maintenance and testing system is unable to establish communication with the battery and either does not detect the ability of the battery to communicate or the presence of a thermistor, the system defaults to a default conditioning, testing, and charging algorithm. The user may also manually choose to recondition the battery, or skip the conditioning and testing of the battery and have the battery immediately charged.

In accordance with yet other aspects of the present invention, the rechargeable battery maintenance and testing system also has a user selectable shelf-life mode. The shelf-life mode measures the self-discharge of the battery that is being tested, i.e., the charge lost over time even when the battery is not connected to a load. The shelf-life mode discharges the battery while monitoring the charge delivered and the voltage level. If either of these levels is below a predefined minimum, the rechargeable battery maintenance and testing system indicates to the user that the battery should be discarded. If, however, the battery delivers a sufficient charge (indicating that the self-discharge is not excessive) the battery is recharged and the rechargeable battery maintenance and testing system transitions to the ready mode.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3 is a perspective view of the upper portion of a first embodiment of a smart battery that may be maintained and tested by the battery maintenance and testing system shown in FIG. 2A;

DETAILED DESCRIPTION OF THE PREFERRED EMBODIMENT

Figure 1:
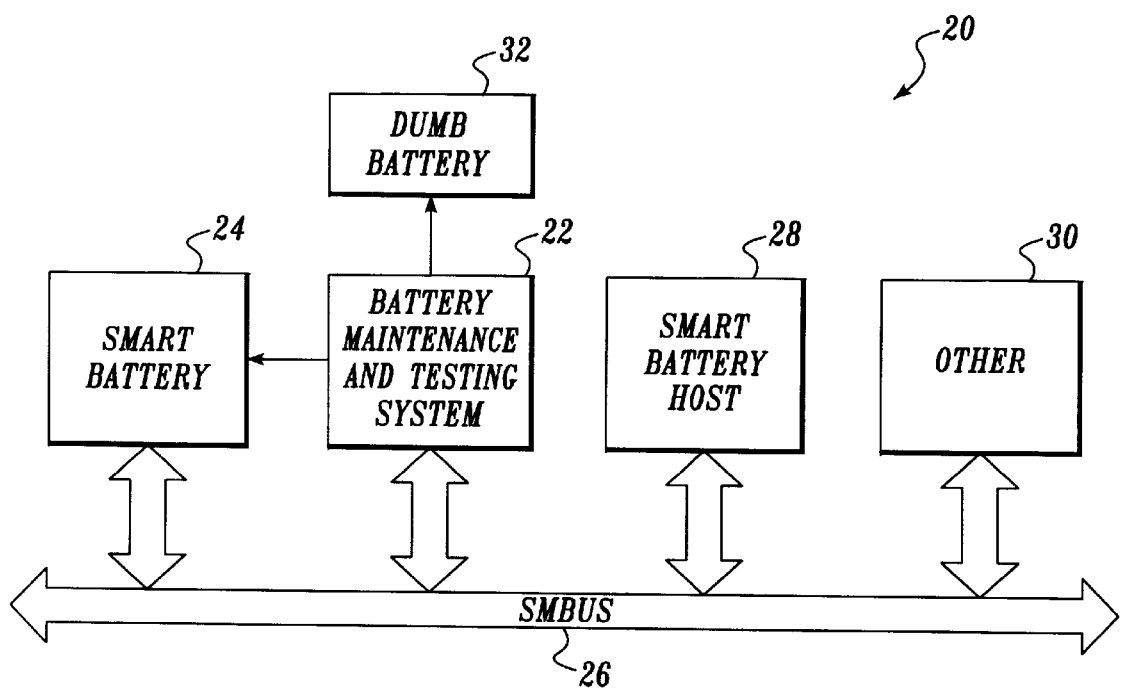
FIG. 1 is a block diagram of a smart battery system including the battery maintenance and testing system of the present invention.

FIG. 1 illustrates a block diagram of a smart battery system 20 that includes a battery maintenance and testing system 22 of the present invention. The smart battery 24 and a battery maintenance and testing system 22, as shown in more detail in FIG. 2A, communicate over a bidirectional communication bus 26. In one embodiment of the present invention, the bi-directional communication bus 26 is based on the SMBus specification as set forth in the *System Management Bus Specification* (Revision 1.0 Feb. 15, 1995) developed by a consortium of battery and computer manufacturers and incorporated herein by reference. The bi-directional communication bus 26 uses an $I^2C$ bus as its backbone that is discussed in detail in the document entitled *The $I^2C$ Bus and How to Use it* by Philips Semiconductors and is also incorporated herein by reference. The smart battery 24 can also communicate over the bi-directional communication bus 26 with a smart battery host 28, such as a portable defibrillator, or with other SMBus compliant devices 30 such as computers or data logging apparatus. However, those of ordinary skill in the art will recognize that communication standards or protocols other than the SMBus and $I^2C$ standards may be used by the present invention, without departing from the scope of the invention. The battery maintenance and testing system 22 is also backward compatible so that it may be used with a battery that lacks the ability to communicate over the bidirectional communication bus 26. A battery which lack this communication capability will be referred to as a dumb battery 32.

Figure 2A:
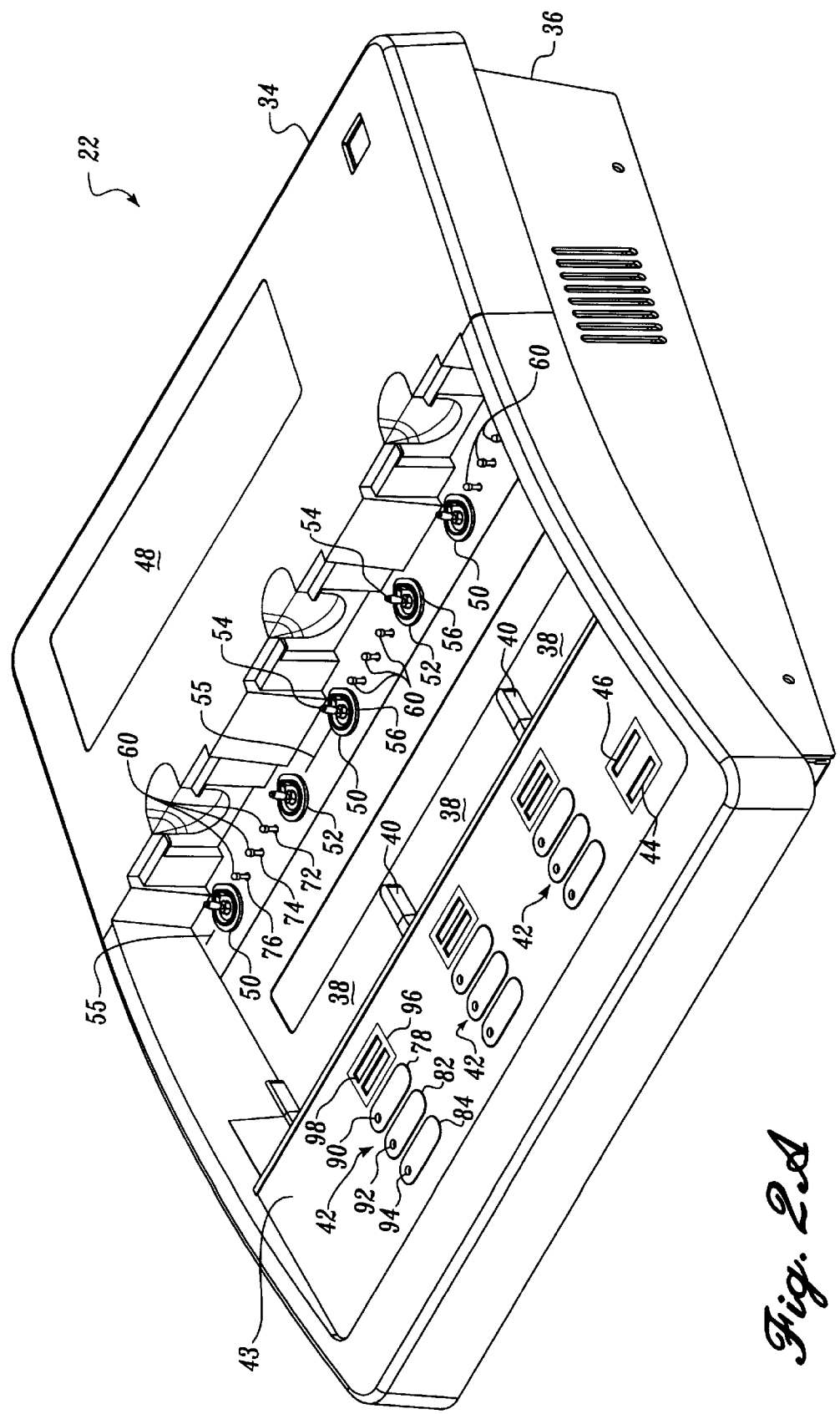
FIG. 2A is an elevated perspective view of a rechargeable battery maintenance and testing system having three battery wells for receiving batteries to be charged, reconditioned or tested.

FIG. 2A shows an actual embodiment of a battery maintenance and testing system 22 that reconditions, tests, recharges, and maintains a smart battery 24 or a dumb battery 32 in accordance with the present invention. It is contains a top cover 34 and a lower tray-shaped base portion 36. The top cover 34 has three battery maintenance wells 38 that are delineated by rail guides or small ribs 40. Each battery maintenance well 38 is substantially identically configured and is capable of holding a single smart battery 24 or a single dumb battery 32. The battery maintenance wells 38 operate independently of each other, so that a smart battery 24 or dumb battery 32 of different types can be inserted into a battery maintenance well 38 without regard to the presence or absence of a smart battery 24 or dumb battery 32 in another battery maintenance well 38.

Each battery maintenance well 38 has an associated display and user interface area 42 on a panel 43 immediately below it. In addition to these three user interface areas 42, panel 43 has a power indicator 44 that displays when the battery maintenance and testing system 22 is activated and a service indicator 46 that displays if the battery maintenance and testing system 22 has determined that it is not operating properly and requires service. Instruction area 48 is provided on the top cover 34 to display instructions for use of the battery maintenance and testing system 22.

Figure 5:
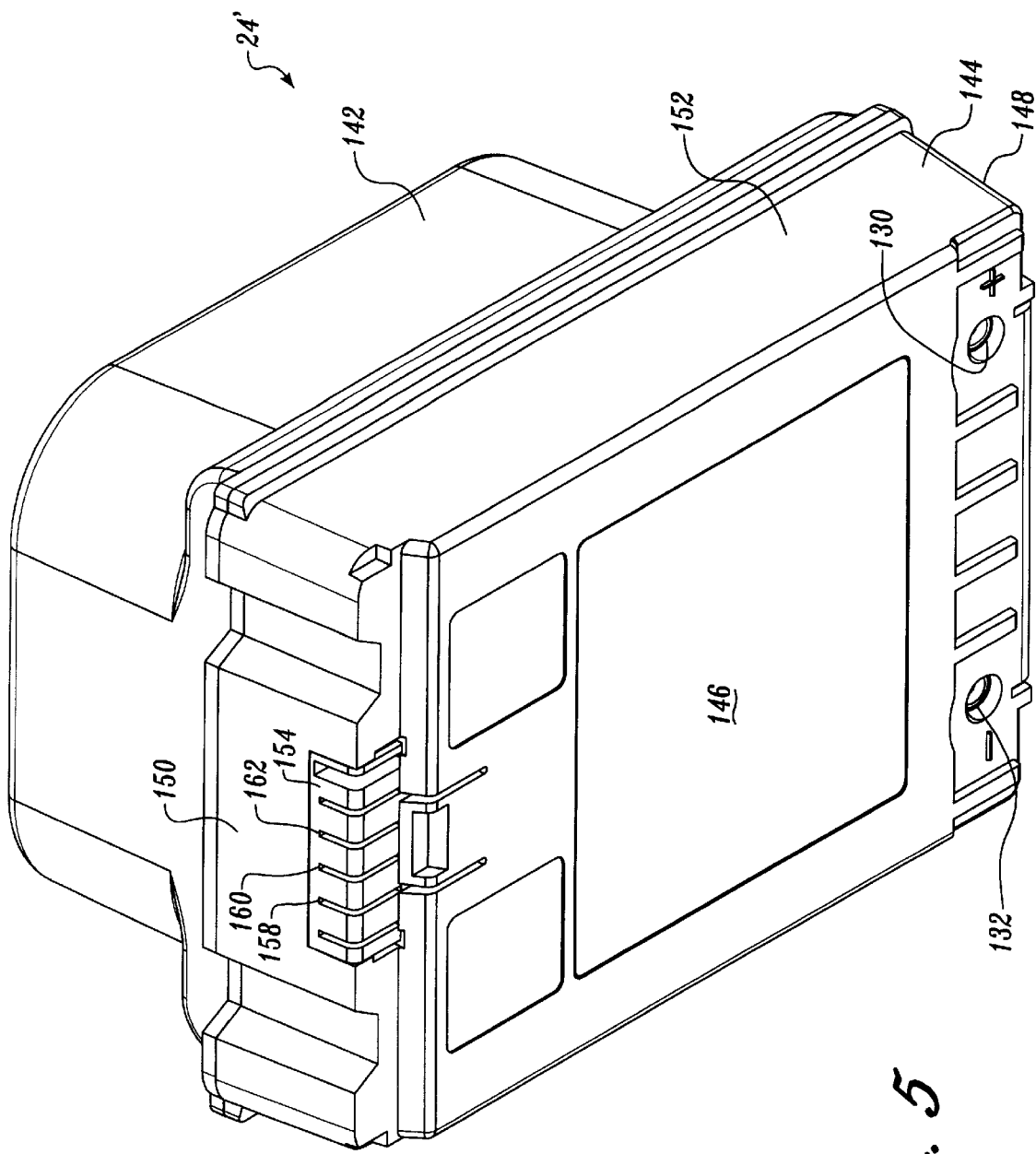
FIG. 5 is a perspective view of the base portion of a second embodiment of a smart battery.

Each battery maintenance well 38 is configured to accept a smart battery 24 as shown in FIG. 3, a dumb battery 32 with the same or similar size and shape as that of the smart battery 24 shown in FIG. 3, or an alternate embodiment of smart battery 24' as shown in FIG. 5. The mechanical interface of the smart battery 24, 24' or dumb battery 32 and the battery maintenance well 38 is the subject of commonly owned U.S. patent application Ser. No. 09/013569, entitled "INTELLIGENT BATTERY AND WELL INTERFACE" filed concurrently herewith, the disclosure and drawings of which are incorporated herein by reference.

Figure 2B:
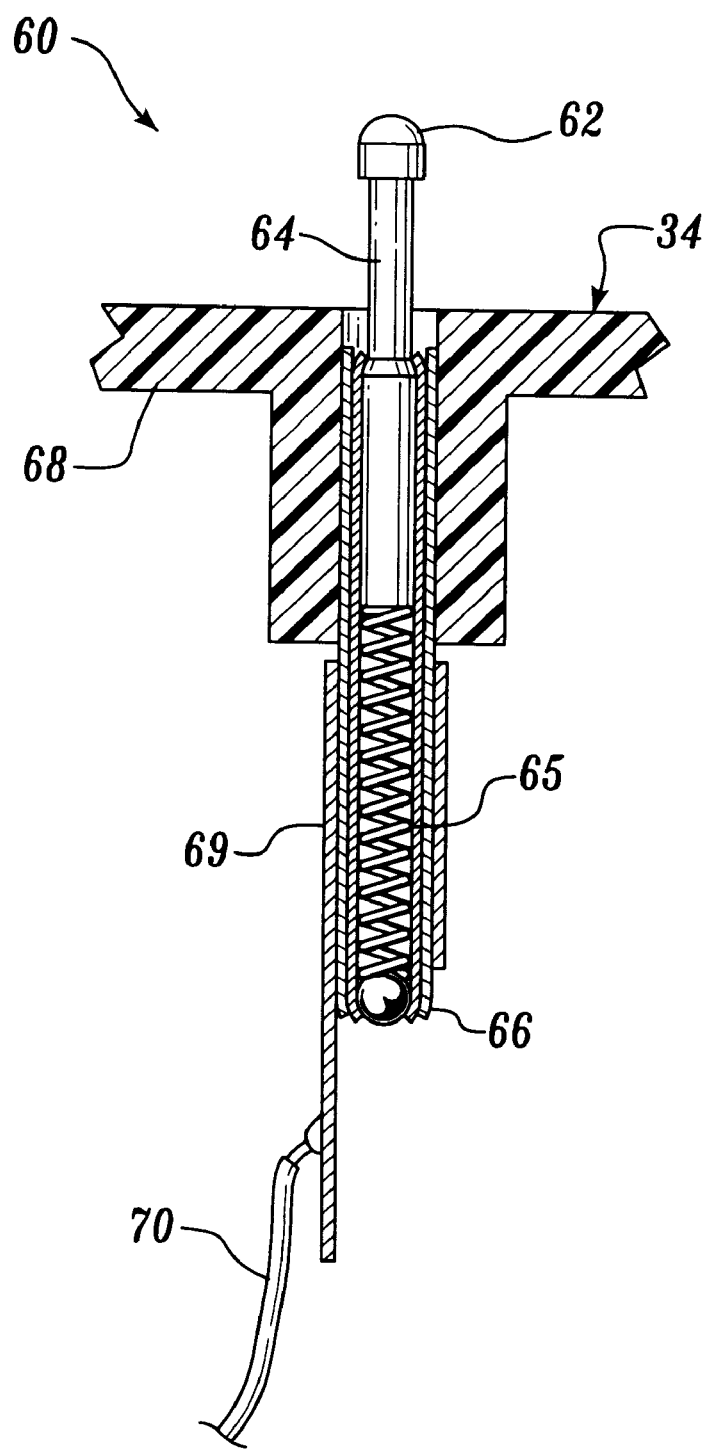
FIG. 2B is a side cross-sectional view of one of three retractable pin-shaped contacts found in each battery well of the rechargeable battery maintenance and testing system shown in FIG. 2A.

Returning to FIG. 2A, each battery maintenance well 38 has a first voltage terminal 50 and a second voltage terminal 52. In an actual embodiment, the voltage terminals 50, 52 are comprised of a male banana plug 54 which is mounted in a rubber grommet 56. Positioned along a longitudinal axis 55 between the first voltage terminal 50 and the second voltage terminal 52 are three retractable pin-shaped contacts 60, which are shown in more detail in FIG. 2B. Each retractable pin-shaped contact 60 is comprised of a rounded contact head 62 which is joined to an intermediate pin section 64. The intermediate pin section is spring-mounted 65 inside a sleeve 66 that is mounted to a bottom portion 68 of the top cover 34. The retractable pin-shaped contacts 60 extend through the top cover 34 into battery maintenance well 38 and provide an electrically conductive path from their rounded contact head 62, through the intermediate pin section 64 and the sleeve 66 to a connector 69 that is attached by a wire 70 to the bidirectional communication bus 26.

Each retractable pin-shaped contact 60 couples a different signal, more specifically, a CLOCK signal communication pin 72 is provided to couple to a CLOCK signal of the bidirectional communication bus 26; a DATA signal communication pin 74 is provided to couple to a DATA line of the bi-directional communication bus 26; and a THERMISTOR signal communication pin 76 is provided for the detection of a thermistor embedded in the smart battery 24.

Each indicator and user interface area 42 is comprised of a first momentary switch 78 that is used in the actual embodiment described herein for the user to request a charge mode 80, a second momentary switch 82 which the user selects to request a condition mode 84, and a third momentary switch 86 that the user selects to request a shelf-life mode 88. The charge, condition and shelf-life modes will be described in more detail below. A first indicator 90 displays when the battery maintenance and testing system 22 is in the charge mode 80, a second indicator 92 displays when the battery maintenance and testing system 22 is in the condition mode 84, and a third indicator 94 displays when the battery maintenance and testing system 22 is in the shelf-life mode 88.

Each indicator and user interface area 42 also has an opaque window 96 that covers a fourth indicator 98 that displays when the battery maintenance and testing system 22 is in a ready mode 100, and a fifth indicator 102 that displays when the battery maintenance and testing system 22 is in a discard mode 104. The ready and discard modes will also be described in more detail below. The fourth and fifth indicators 98 and 102 only show through an opaque window 96 of the indicator and user interface area 42 when they are activated.

A first actual embodiment of a smart battery 24 is shown in FIG. 3. This embodiment of the smart battery 24 has an upper section 110 that is ultrasonically welded to a base portion 112 when assembled. An interior cavity formed between the upper section 110 and the base portion 112 holds the battery cells and electronic circuitry of the smart battery 24. The electronic circuitry is coupled to a momentary contact switch 114 and a plurality of display indicators 118. The momentary contact switch is positioned immediately below a depressible keypad 114 and a display window 116 on the upper portion 110. The upper portion 110 also has an area 120 for the display of written instructions. The smart battery 24 is more fully described in commonly owned U.S. patent application Ser. No. 60/072485 entitled "SMART BATTERY WITH BATTERY MAINTENANCE AND TESTING FUNCTIONS AND DISPLAY," filed concurrently herewith, the disclosure and drawings of which are incorporated herein by reference.

Figure 4:
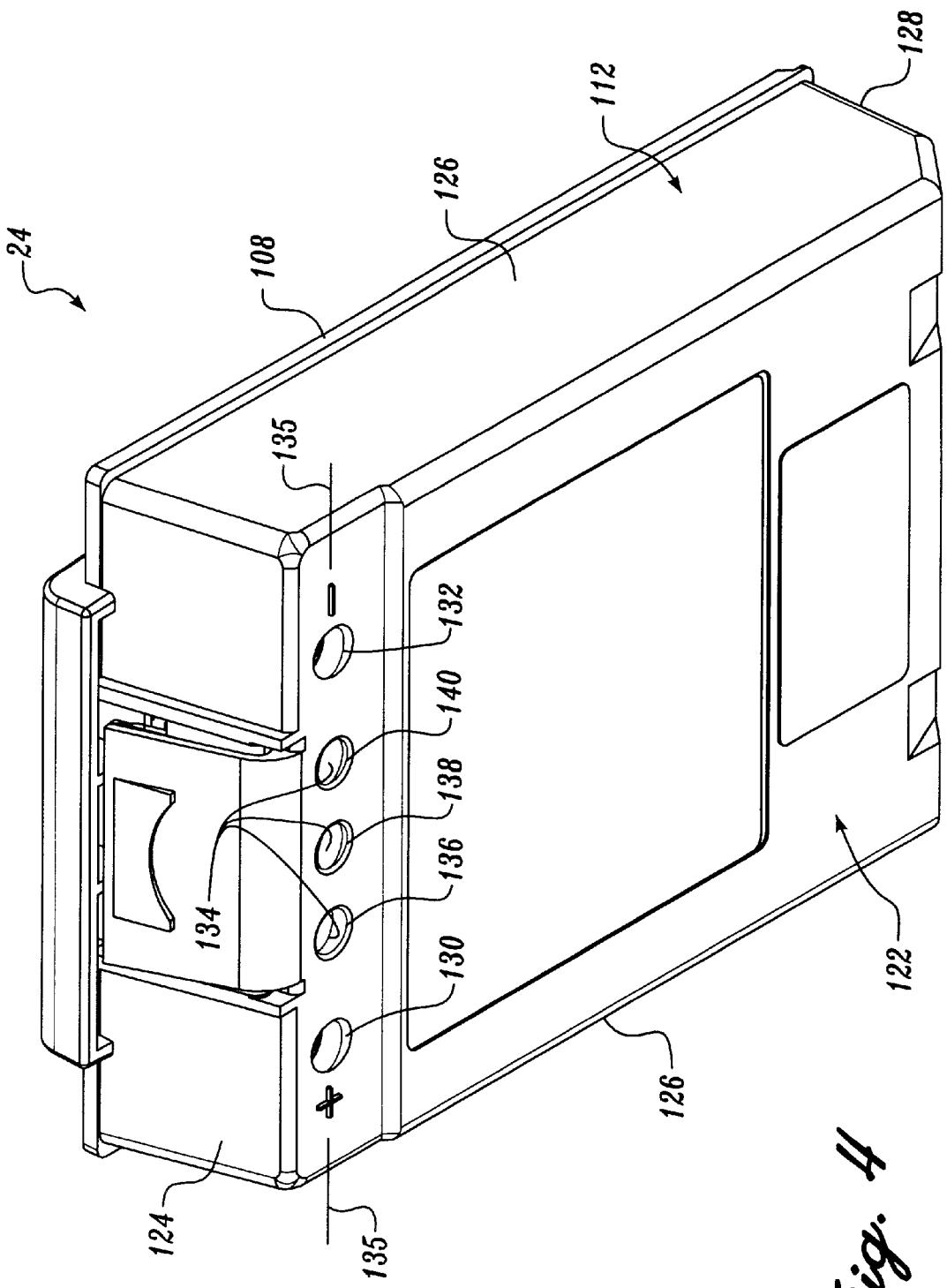
FIG. 4 is a perspective view of the base portion of the first embodiment of the smart battery.

In FIG. 4, the bottom of a first actual embodiment of the smart battery 24 is shown. The base portion 112 has a bottom face 122, a second end 124, side faces 126 and a first end 128. There is a first voltage receptacle or aperture 130, a second voltage receptacle or aperture 132 and three communication interface pads 134 aligned on a longitudinal axis 135 on the bottom face 122 of the base portion 112 of the smart battery 24. Consequently, when the smart battery 24 is inserted into the battery maintenance well 38, the first voltage receptacle 130 interfaces with the first voltage terminal 50, the second voltage receptacle 132 interfaces with the second voltage terminal 52, and the three communication interface pads (or circular conductive contacts) 134 interface with the retractable pin-shaped contacts 60. Further, a CLOCK signal communication pad 136 couples with the CLOCK signal communication pin 72; a DATA signal communication pad 138 couples with the DATA signal communication pin 74; and a THERMISTOR signal communication pad 139 couples with the THERMISTOR signal communication pin 76. As mentioned above, the banana plugs 54 are mounted in rubber grommets 56. This assists in the interfit of the banana plugs 54 of the first and second voltage terminals 50 and 52 with the first and second voltage receptacles 130 and 132 by allowing the banana plugs 54 to move slightly to accommodate the smart battery 24 as it is inserted.

It will be appreciated that a dumb battery 32 has an identical base portion portion 112 as the first actual embodiment of the smart battery 24 shown in FIG. 4, except that it has no internal electronics and therefore no need for communication interface pads 134. When inserted into the battery maintenance well 38, the dumb battery 32 has a first voltage receptacle 130 that interfits with a first voltage terminal 50, and a second voltage receptacle 132 that interfits with second voltage terminal 52. Since the retractable pin-shaped contacts 60 are spring mounted, when the dumb battery 32 is inserted in the battery maintenance well 38, the retractable pin-shaped contacts 60 recede into their respective sleeves 66 and therefore do not interfere with the insertion of the dumb battery 32 into the battery maintenance well 38.

A second actual embodiment of the smart battery 24' is shown in FIG. 5. This embodiment of the smart battery 24' has an upper section 142, and a base portion 144 that has a bottom face 146, a second end 148, a first end 150, and two side faces 152. The upper portion 142 and the base portion 144 define an interior portion that contains the embedded electronics and the battery cells. This embodiment also has a first voltage receptacle or aperture 130 for interfit with the first voltage terminal 50 and a second voltage receptacle or aperture 132 for interfit with the second voltage terminal 52 of the battery maintenance and testing system 22. In substitution for the communication interface pads 134 found in the previously described embodiment of the smart battery 24', the smart battery 24' provides a blade connector 154 with a CLOCK signal blade slot 158, a DATA signal blade slot 160, and a THERMISTOR signal blade slot 162 on the opposite end of the smart battery 24' from the contact wells.

Figure 6:
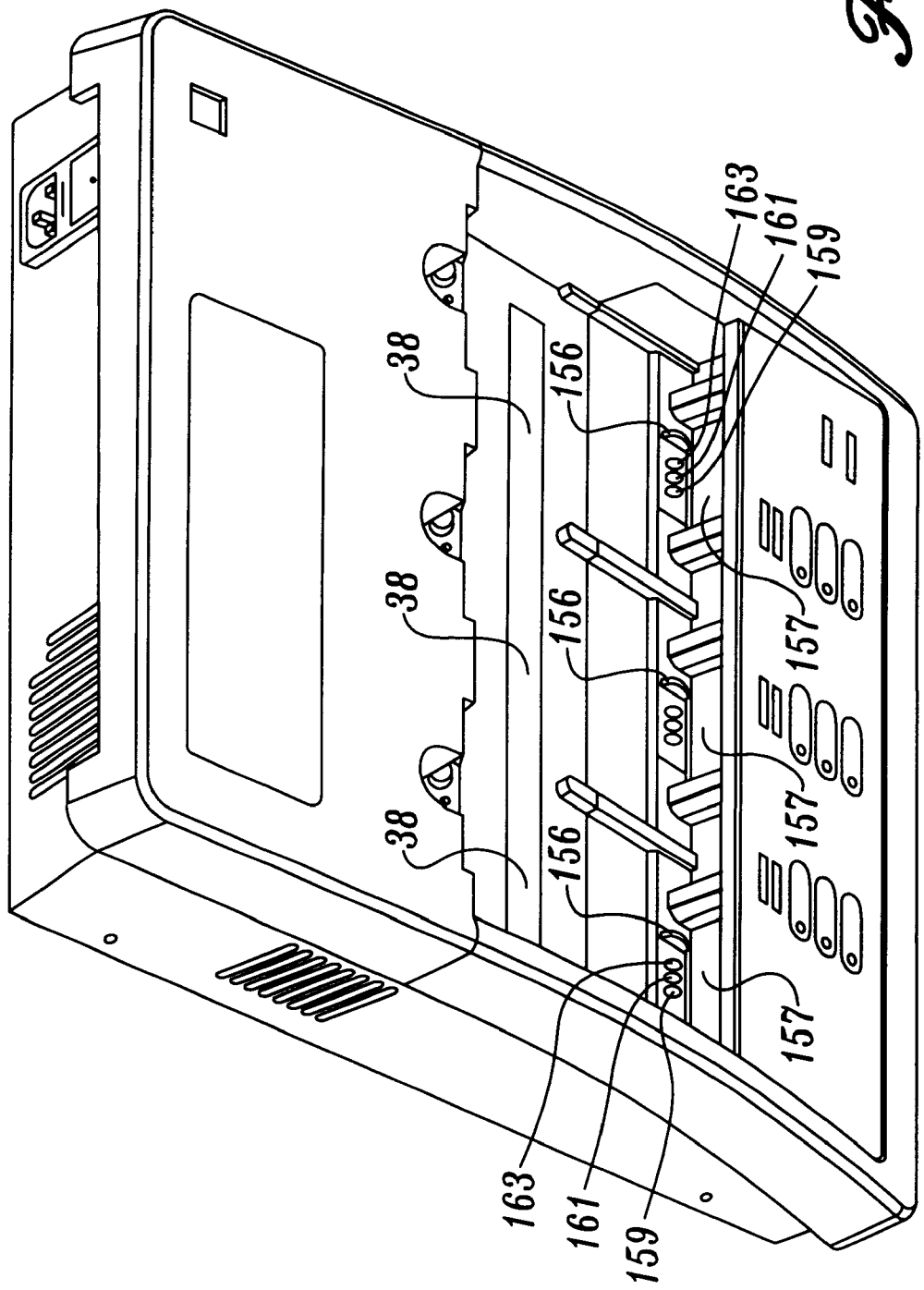
FIG. 6 is an elevated perspective view of the rechargeable battery maintenance and testing system as viewed from a reverse perspective from that of FIG. 2A and showing the rechargeable battery maintenance and testing system's battery wells.

As shown in FIG. 6, each battery maintenance well of the battery maintenance and testing system 22 includes a corresponding blade connector 156 located in a lower end 157 of the well 38. Accordingly, when the smart battery 24' is inserted into the battery maintenance well 38, the blade connector 154 on the smart battery 24' couples with the corresponding blade connector 156. The corresponding blade connector 156 has a CLOCK signal blade 159, a DATA signal blade 161, and a THERMISTOR signal blade 163, for respective interconnection with the CLOCK signal blade slot 158, DATA signal blade slot 160, and THERMISTOR signal blade slot 162 of the blade connector 154. The first end 150 of the smart battery 24' is specially configured to position the blade connector 154 for proper interfit with corresponding blade connector 156.

In the dumb battery 32 and the first actual embodiment of the smart battery 24 shown in FIGS. 3 and 4, the battery comprises a nickel cadmium chemistry. In the second embodiment of the smart battery 24', the battery is comprised of a sealed lead acid chemistry. It will be appreciated that any battery chemistry may employ the configuration of the base portion 112 of the first embodiment of the smart battery 24 or the base portion 144 of the second embodiment of the smart battery 24'. However, the shape of the upper portion of the battery, whether smart or dumb, can be of any suitable configuration appropriate to the desired battery chemistry since the shape of the upper portion does not affect the insertion of the smart battery 24, 24' or dumb battery 32 into the battery maintenance well 38. Since the battery maintenance and testing system 22 of the present invention may be used to maintain smart batteries 24, 24' or dumb batteries 32, further reference will be made only to the smart battery 24 or more generically, "a battery," for ease of explanation unless specifically stated otherwise.

Figure 7:
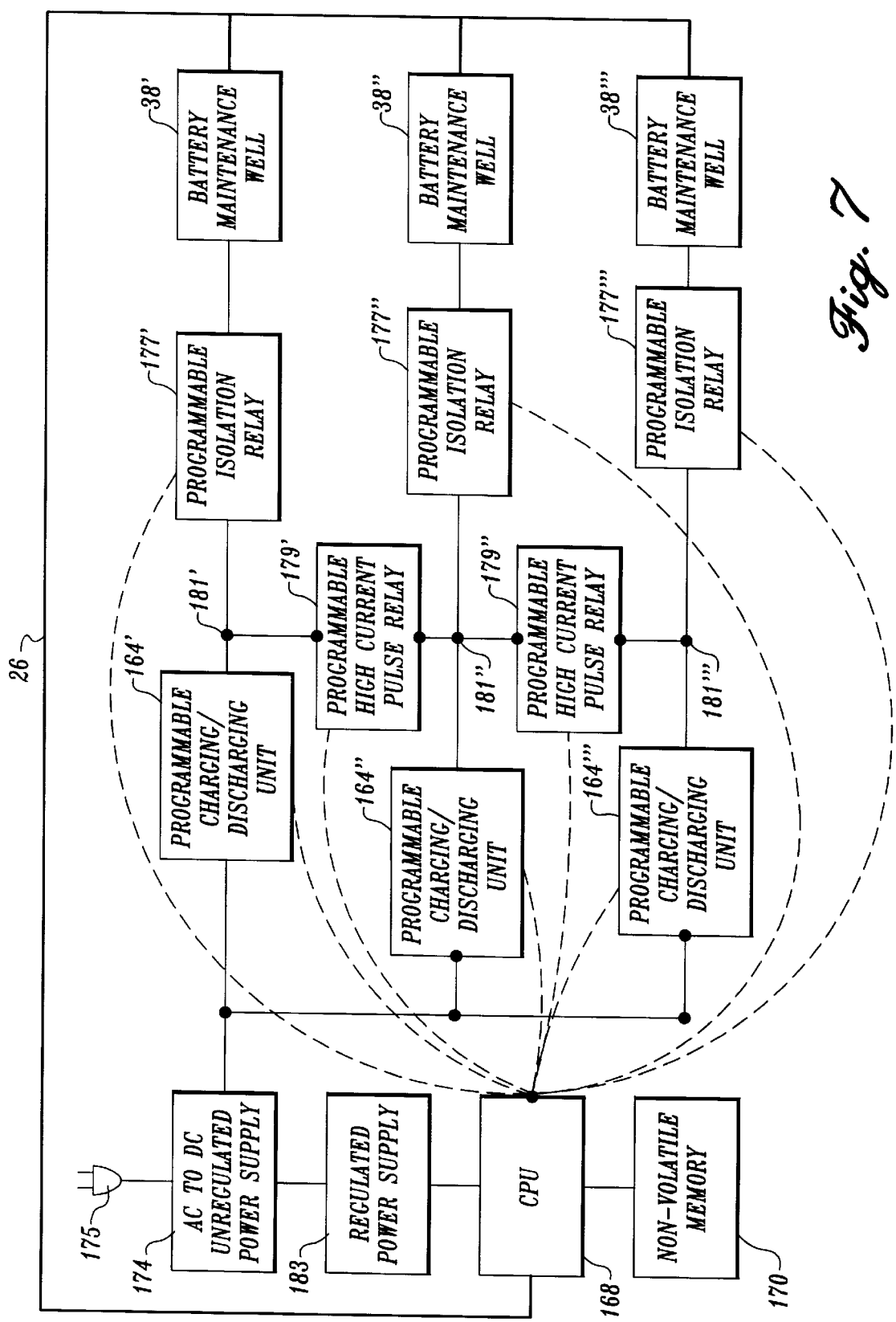
FIG. 7 is a block diagram of the circuitry of the rechargeable battery maintenance and testing system shown in FIG. 2A.

The circuitry of the battery maintenance and testing system 22 is represented in block form in FIG. 7. As noted above, the battery maintenance and testing system 22 has three identical battery maintenance wells 38, each with first and second voltage terminals 50, 52. The voltage terminals 50 and 52 of a first battery maintenance well 38' are coupled to a first programmable isolation relay 177' that is then coupled to a programmable charging and discharging unit 164'. The voltage terminals 50 and 52 of a second battery maintenance well 38" are coupled to a second programmable isolation relay 177" that is then coupled to a second programmable charging and discharging unit 164". The voltage terminals 50 and 52 of a third battery maintenance well 38'" are coupled to a third programmable isolation relay 177'" that is then coupled to a third programmable charging and discharging unit 164'".

As will be described in more detail below with reference to FIG. 11, the pulse discharge test requires a high current discharge of the battery 24 that is being tested in one of the maintenance wells 38. In one embodiment of the pulse discharge test, a pulse of 6 amps is drawn from the battery

24, 24' or 32 under test. Because this 6 amp current flow exceeds the current rating of any single programmable charging and discharging unit 164, they are temporally connected in parallel so as to provide three discharge paths rated at 2 amps each. This temporary connection is formed by closing a first programmable high current pulse relay 179' that is connected between a first junction 181' and a second junction 181". The first junction 181' is located at the coupling of the first isolation relay 177' and the first programmable charging and discharging unit 164'. The second junction 181" is located at the coupling of the second isolation relay 177" and the second programmable charging and discharging unit 164". Similarly, a second programmable high current pulse relay 179' is connected between the second junction 181" and a third junction 181'". The third junction 181'" is located at the coupling of the third isolation relay 177'" and the third programmable charging and discharging unit 164'".

Figure 8:
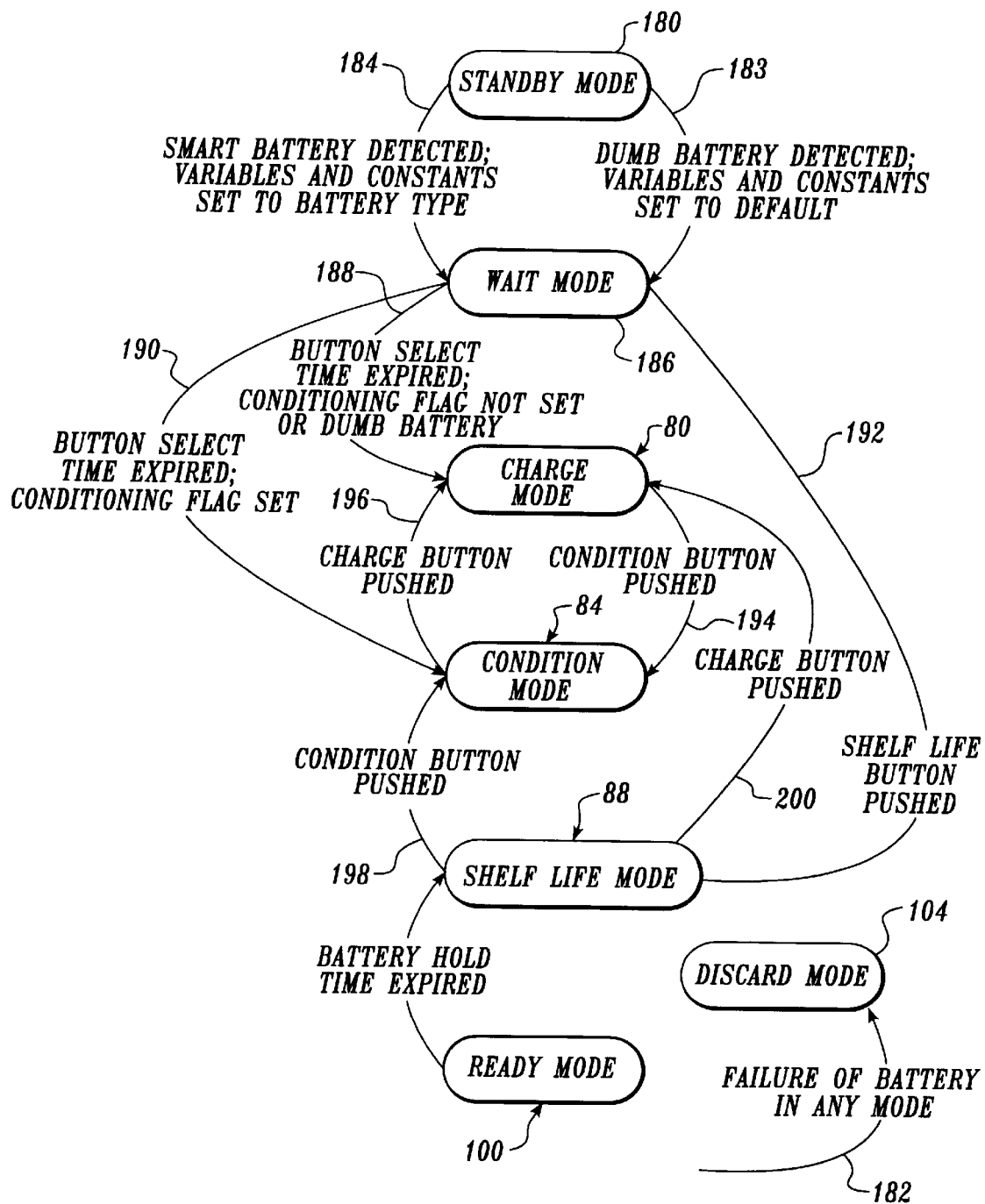
FIG. 8 is a state diagram showing the modes that the battery maintenance and testing system enters in order to perform maintenance and testing in accordance with the present invention.

As indicated schematically by the dashed lines in FIG. 7, the programmable isolation relays 177', 177", 177'", the programmable high current relays, 179', 179" and the programmable charging and discharging units 164', 164", 164'" are all coupled to and controlled by a central processing unit (CPU) 168. The CPU 168 receives its power from a regulated power supply 183 that is coupled to the AC to DC unregulated power supply 174. The CPU 168 is coupled to a non-volatile memory 170 from which it obtains its program instructions and other information. The program instructions executed by the CPU 168 essentially implement the various modes of the battery maintenance and testing system 22 that are illustrated in FIG. 8. The three retractable pin-shaped contacts 60 and the complementary blade connector 156 found in each battery maintenance well 38 are also coupled to the CPU 168 by the bidirectional communication bus 26.

When the battery maintenance and testing system 22 charges a smart battery 24 in the first maintenance well 38', the CPU instructs the programmable isolation relay 177' to close, the programmable high current pulse relay 179' to open, and the programmable charging discharging unit 164' to source current to the battery according to a charging algorithm that is specific to the battery's chemistry. When the battery is discharged, for instance during conditioning, the programmable isolation relay 177' is also closed, the programmable high current pulse relay 179' is opened, and the programmable charging and discharging unit 164' is programmed to sink current from the battery according to a discharging charging algorithm that is also specific to the battery's chemistry. Appropriate charging and discharging algorithms for specific battery chemistries are well known in the art, therefore, a detailed description of them is not necessary for an understanding of the present invention.

Each battery maintenance well 38 charges and discharges a battery independently of the other two wells 38 in the same manner as described above. However, while a pulse is drawn from a battery in one well, the charging or discharging in the other two wells is temporarily suspended. This is because all three programmable charging and discharging units 164 are needed to sink the high current that is drawn during the pulse discharge test. For instance, if a battery subject to the pulse discharge test is in first battery maintenance well 38', the CPU programs the first programmable isolation relay 177' to close and the second and third programmable isolation relays, 177" and 177'" to open. This isolates battery maintenance wells 38" and 38'" from the circuit during the pulse. The CPU also instructs the programmable pulse discharge relays 179' and 179" to close, thereby creating the parallel circuit through junctions 181', 181", 181'". The CPU then programs the programmable charging and discharging units 164 to discharge the battery at high current for a short duration. Following this pulse, the CPU reinstates the standby mode, charging mode, or conditioning mode of the other two battery maintenance wells to the state they were in prior to the pulse discharge test.

FIG. 8 is a state diagram that illustrates the mode capable of being implemented by the battery maintenance and testing system 22, either automatically or due to the user's manual control. The state diagram of FIG. 8 will be described with reference to the first embodiment of the smart battery 24 described above. However, those of ordinary skill in the art will appreciate that the modes implemented by the battery maintenance and testing system 22 are the same, regardless of the type of communications interface, e.g., communication pin or blade connector, employed by the smart battery.

When there is not a battery inserted into a battery maintenance well 38, the battery maintenance and testing system 22 is in stand-by mode 180. In the stand-by mode 180, the battery maintenance and testing system 22 is continuously polling the battery maintenance wells 38 until it detects a battery by finding a voltage between the first and second voltage terminals 50 and 52. The battery maintenance and testing system 22 then determines whether it can detect communication on the bi-directional communication bus 26 and the presence of a THERMISTOR on the circuit of the THERMISTOR signal communication pin 76 and the THERMISTOR signal communication pad 139. If both of these are found, the battery maintenance and testing system 22 obtains the variables and constants maintained by the smart battery 24. Among the variables and constants obtained over the bi-directional communication bus 26 is the type of battery, its state of charge, whether the battery needs to be conditioned, and whether the battery has detected a fault and has determined that it needs to be discarded. If the battery indicates that it needs to be discarded, the battery maintenance and testing system 22 transitions to discard mode 104 as indicated by line 182. Otherwise, the battery maintenance and testing system 22 transitions 184 to wait mode 186. If communication was not found and not expected (i.e., no THERMISTOR signal), the battery maintenance and testing system 22 assumes that the battery inserted is a dumb battery 32 sets the variables and constants to a default battery type, and transitions 183 to wait mode 186.

In wait mode 186, the battery maintenance and testing system 22 waits a short amount of time (approximately 3 seconds) for the user to push one of the momentary switches 78, 82 or 86 on the corresponding indicator and user interface area 42. If first momentary switch 78 is pushed by the user, the battery maintenance and testing system 22 transitions 188 to the charge mode 80. If second momentary switch 82 is pushed, the battery maintenance and testing system 22 transitions 190 to the conditioning mode 84. If the third momentary switch 86 is pushed, the battery maintenance and testing system 22 transitions 192 to the shelf-life mode 88. If none of these buttons are pushed during the time period defined in the wait mode 186, then the battery maintenance and testing system 22 will automatically transition 190 to the conditioning mode 84 if the conditioning flag has been set on the bi-directional communication bus 26 by the smart battery 24 itself If, however, the conditioning flag has not been set, or if a dumb battery 32 has been inserted into the battery maintenance well 38, then the battery maintenance and testing system 22 transitions 188 to the charge mode 80. In the charge mode 80, the user can select second momentary switch 82 to transition 194 to condition mode 84. In the conditioning mode 84, the user can select first momentary switch 78 to transition 196 to the charge mode 80. Similarly, the user is allowed to transition 198 from the shelf-life mode 88 to the condition mode 84 by pushing second momentary switch 82, or to transition 200 to the charge mode 80 by pushing first momentary switch 78.

Figure 9:
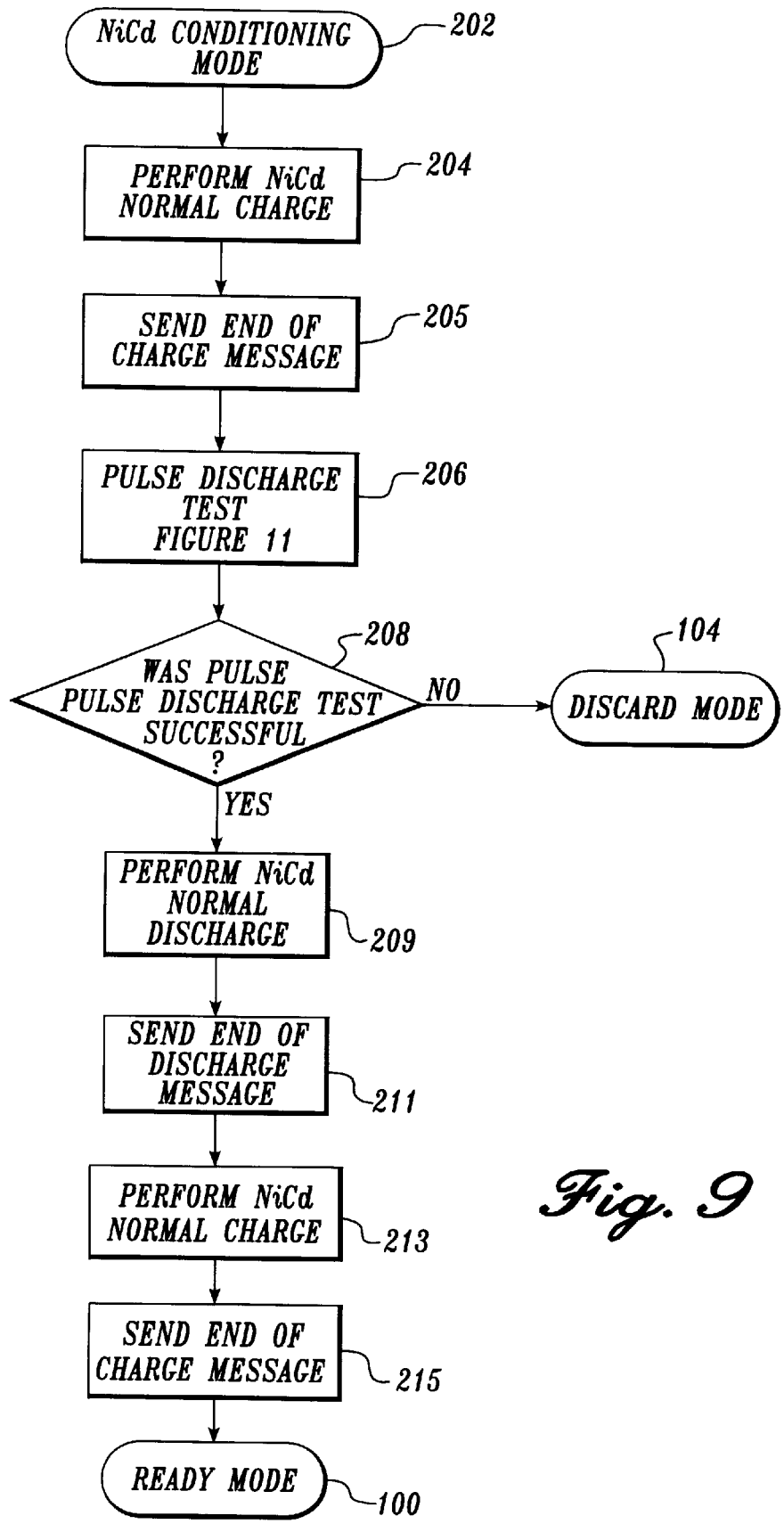
FIG. 9 is a flow diagram of a conditioning mode for the nickel cadmium (NiCd) battery chemistry.

The transition to the conditioning mode 84 involves choosing the proper conditioning mode for the appropriate battery chemistry. The identifying information for the battery type is either communicated over the bi-directional communication bus 26 or is set to a default setting, if the battery maintenance and testing system 22 concludes that a dumb battery 32 has been inserted into battery maintenance well 38. If the battery 24 is identified by communication or default as a NiCd, then a NiCd conditioning routine 22 illustrated in FIG. 9 is performed by the battery maintenance and testing system 22. The NiCd conditioning mode 202 first performs a normal charge of the battery in a block 204, and then sends an "End of Charge" message to the battery 24 in a block 205 that will be discussed below. Those of ordinary skill in the art will recognize that charging algorithms for NiCd batteries are well known in the art and thus need not be discussed in further detail herein. Next, in a block 206, for an understanding of the present invention, a pulse discharge test is performed, that will be discussed in more detail below with reference to FIG. 11. In a decision block 208, the battery maintenance and testing system 22 decides if the pulse discharge test of a block 206 was successful. If the pulse discharge test of a block 206 was unsuccessful, the battery maintenance and testing system 22 transitions to discard mode 104.

If the pulse discharge test is completed successfully, the battery is then discharged in a block 209 to its end discharge voltage. When this end discharge voltage is reached, the CPU168 sends an "End of Discharge" message to the battery 24 in a block 211 on the communication bus. Next, in a block 213, the battery maintenance and testing system charges the battery and then sends an "End of Charge" message to the battery 24 in a block 215 on the communication bus 26 when it detects that battery has been fully charged. In the NiCd embodiment of the invention, a negative delta voltage is detected to determine that the battery has been fully charged. The negative delta voltage of a NiCd battery and methods for detecting it are well known in the art and thus, need not be discussed in further detail for an understanding of the present invention. The battery maintenance and testing system 22 then transitions to ready mode 100.

Figure 10:
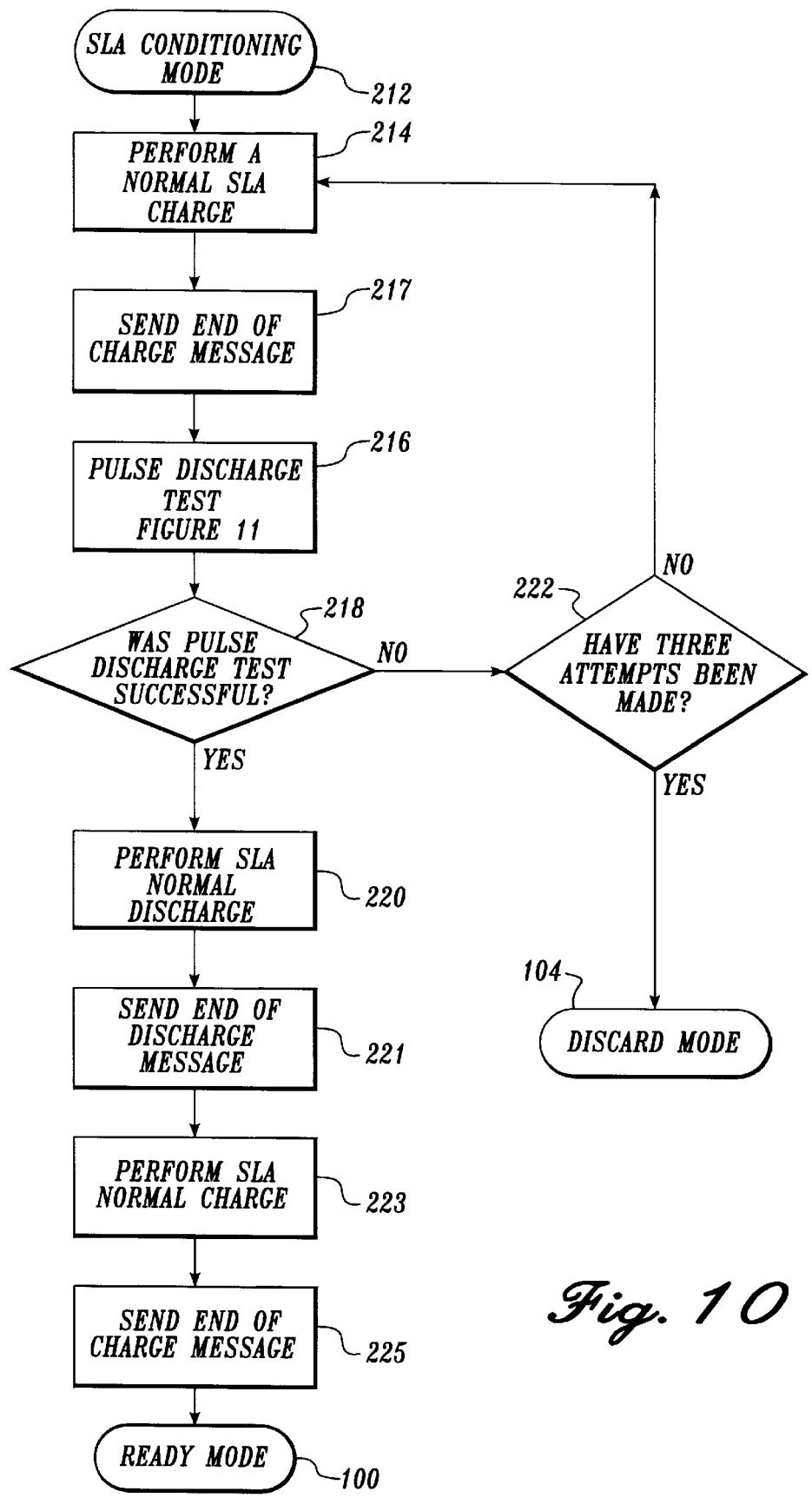
FIG. 10 is a flow diagram of a conditioning mode for the sealed lead acid (SLA) battery chemistry.

The conditioning mode 212 for the SLA battery chemistry is illustrated in FIG. 10. The SLA conditioning mode 212 first performs a normal SLA charge in a block 214 and then sends an "End of Charge" message to the battery 24 in a block 217 as has been discussed above. A pulse discharge test (FIG. 11) is then performed in a block 216. Next, in a block 218, the battery maintenance and testing system 22 determines if the pulse discharge test of block 216 was successful. If the test was unsuccessful, then the SLA chemistry battery is given another attempt to pass the test in a decision block 222. If three attempts have not been made, the algorithm returns to a block 214 and repeats the process described above. It will be appreciated that three attempts are made to condition the battery because it has been found empirically that a battery with an SLA chemistry may recover its ability to retain a sufficient charge for the pulse discharge test if it is cycled up to three times. It is believed that this eliminates the sulfation that may build up in a SLA battery. If, however, the SLA battery has not passed the pulse discharge test by the time that it has been cycled three times, i.e., if the result of decision block 22 is negative, the battery maintenance and testing system 22 will transition to discard mode 104. If the battery passes the pulse discharge test, the battery is then discharged in a block 220 to its end discharge voltage. When this end discharge voltage is reached, the battery maintenance and testing system 22 sends an "End of Discharge" message to the battery 24 in a block 221 on the communication bus 26.

Next, in a block 223, the battery is then charged normally again. In a block 225, the battery maintenance and testing system 22 sends an "End of Charge" message to the battery 24 on the communication bus 26 when it detects that battery has been fully charged. In the SLA embodiment of the invention, the battery maintenance and testing system 22 detects a current plateau to determine that the battery has been fully charged. This current plateau detection method and the charging algorithms and routines for SLA batteries are well known in the art and thus, need not be discussed in further detail for an understanding of the invention. Once charging is completed and the appropriate message is sent, the battery maintenance and testing system 22 then transitions to ready mode 100.

Figure 11:
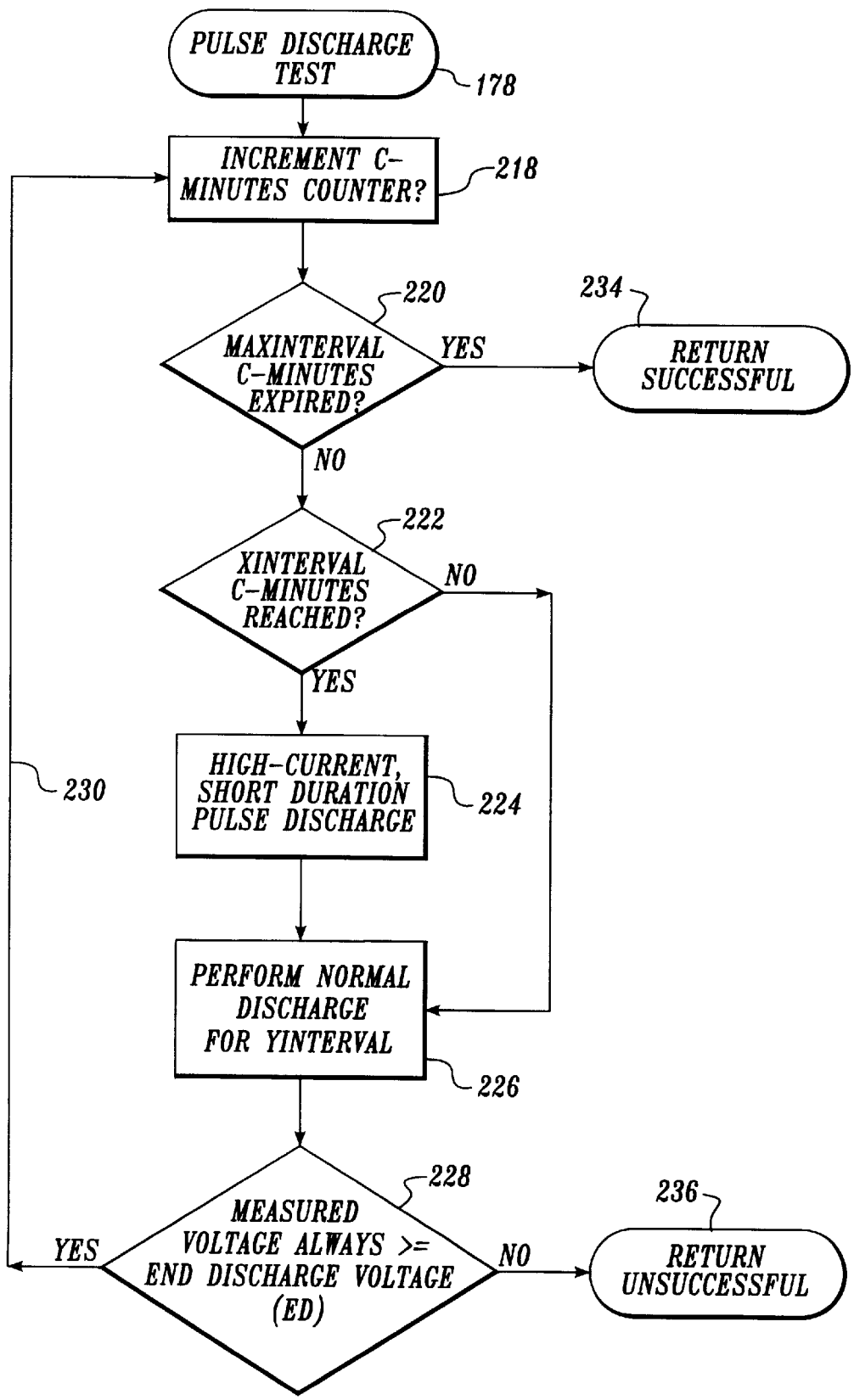
FIG. 11 is a flow diagram of a pulse discharge test implemented by the conditioning mode.

In FIG. 11, the pulse discharge test 178 implemented in the condition mode 84 is illustrated. For the purposes of the pulse discharge test 178, the discharge current of a battery under test is measured in C-minutes. One C-minute is defined as an amount of charge Q, where Q=1 C*1 minute, and where 1 C is defined as the current that would discharge a full capacity battery in one hour. Most portable batteries are rated at 1 C. Therefore, discharging the battery at a 1 C-rate means that the battery will deliver its rated capacity for one hour. For instance, if a battery is rated at 1.5 Amp hours, it will be drained of its capacity if discharged at a rate of 1.5 Amps for one hour.

In one actual embodiment of the invention, the battery under test is subject to a 15 second, 6 amp discharge every 10 C-minutes, i.e., a "XInterval," during the first 33 C-minutes, i.e., a "MaxInterval" while the battery is being discharged. Therefore, there are three high-current discharges during the pulse discharge test. The MaxInterval of 33 minutes is desirable because it confines the pulse discharge test to a period when the battery still has at least 25% of its nominal capacity remaining. This proves the battery's ability to deliver the high current pulses required by a defibrillator by stressing the battery through the full range of charge during which the battery would be expected to be used. To insure that the battery has at least 25% of its nominal capacity remaining during the test, a worst case NiCd battery whose actual capacity is only 80% of nominal is assumed. This means that the battery can be discharged to approximately 55% of its actual capacity before it reaches the lower limit of 25% of its nominal capacity (80%–25%= 55%). Therefore, the battery should be able to deliver 33 C-minutes (55% of 1 C-hour=33 C-Minutes) of charge before reaching the lower limit of 25% of nominal capacity. It will be recognized by those skilled in the art that the current draw and duration of the pulse may be adjusted to emulate the particular needs of the host system and are not limited to the values suggested above.

In a block 218, the battery maintenance and testing system 22 is continuously monitoring the discharge of the battery under test in C-minutes. The value of the C-minutes counter in a block 218 is then compared against the MaxInterval in a block 220 to determine if the pulse discharge test 178 is over. If the MaxInterval in the block 220 has not been reached, then a decision is made in a block 222 if the time to pulse the battery has been reached (XInterval). If XInterval has been reached in a block 222, then the battery under test is subjected to a high current, short duration, pulse discharge in a block 224. As mentioned above, the preferred embodiment of the invention pulses the battery at 6 amps for a period of 15 seconds at an Xinterval of 10 minutes. Following this pulse discharge in block 224, the battery continues to be discharged in step 226 in a conventional manner until the time for the next pulse discharge (XInterval) is reached in a block 222.

The voltage level of the battery under test is continuously being monitored and compared against an end discharge voltage in a block 228. The end discharge voltage is a minimum level below which the battery is assumed to be defective. If the voltage of the battery under test always exceeds or equals the end discharge voltage, the test continues via branch 230. Once the MaxInterval of C-minutes has expired in a block 220, or in other words, the test has been concluded, a successful result is returned in a block 234. Otherwise, if voltage level of the battery under test ever dips below the end discharge voltage in a block 228, an unsuccessful result is returned in a block 236. As was mentioned above, if an unsuccessful result is returned to the NiCd conditioning mode 202, the battery maintenance and testing system 22 enters the discard mode 104. If, however, an unsuccessful pulse test is returned to the SLA conditioning mode 212, the battery may be given additional chances (up to three) to repeat the pulse discharge test of FIG. 11.

Figure 12:
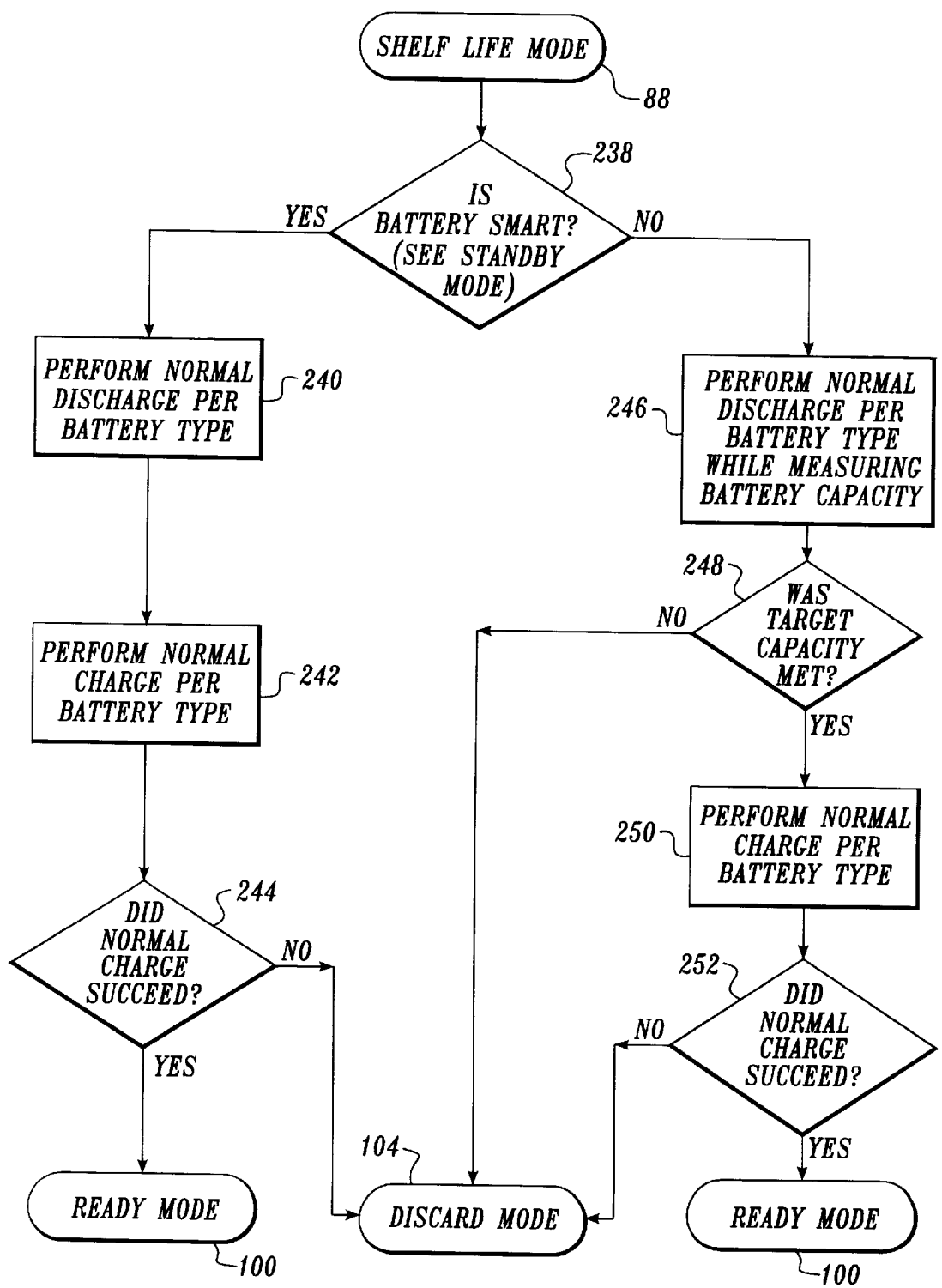
FIG. 12 is a flow diagram of a shelf-life mode.

The shelf-life mode 88 is illustrated in FIG. 12. As discussed above, the battery maintenance and testing system 22 determines in a decision block 238 whether the battery inserted in the battery maintenance well 38 is a smart battery 24 or a dumb battery 32. If the battery inserted is a smart battery 24, then it is cycled by first discharging the battery in a block 240 according to its battery type, and then charged according to its battery type in a block 242. The battery maintenance and testing system 22 then checks in a decision block 244 whether the charge succeeded, and if it did, the battery maintenance and testing system 22 transitions to the ready mode 100. On the other hand, if the charge did not succeed, the battery maintenance and testing system 22 transitions to the discard mode 104. No other test is needed for the smart battery 24 because it maintains its own self-discharge information.

If, however, the battery inserted into the battery maintenance well 38 is a dumb battery 32, then the battery maintenance and testing system 22 performs a normal discharge while measuring the actual delivered capacity of the battery in a block 246. The actual delivered capacity is then compared to a minimum target capacity in a block 248. If the minimum target capacity is not met in a decision block 248, the battery maintenance and testing system 22 transitions to the discard mode 104. If the target capacity is met in a block 248, then the battery is charged in a block 250. If the charge is successful, as is decided in a block 252, then the battery maintenance and testing system 22 transitions to ready mode 100. If the battery charge was not successful, the battery maintenance and testing system 22 transitions to discard mode 104.

The purpose of the shelf-life mode 88 is to measure the self-discharge of the battery under test. A smart battery 24 monitors its own self-discharge and reports an excessive self-discharge as a recommendation to the battery maintenance and testing system 22 to enter discard mode 104 which signals the user that the battery should be discarded. However, a dumb battery 32 has no self-discharge monitoring capability. The shelf-life mode 88, therefore, requires that the user first charge the battery to its full capacity and then to store the battery open-circuited for at least a week. Discharging the battery in a block 246 while measuring the capacity and then comparing it against the target capacity in a block 248 will expose if there was excessive self-discharge of the battery while it sat on the shelf.

Figures 13, 14:
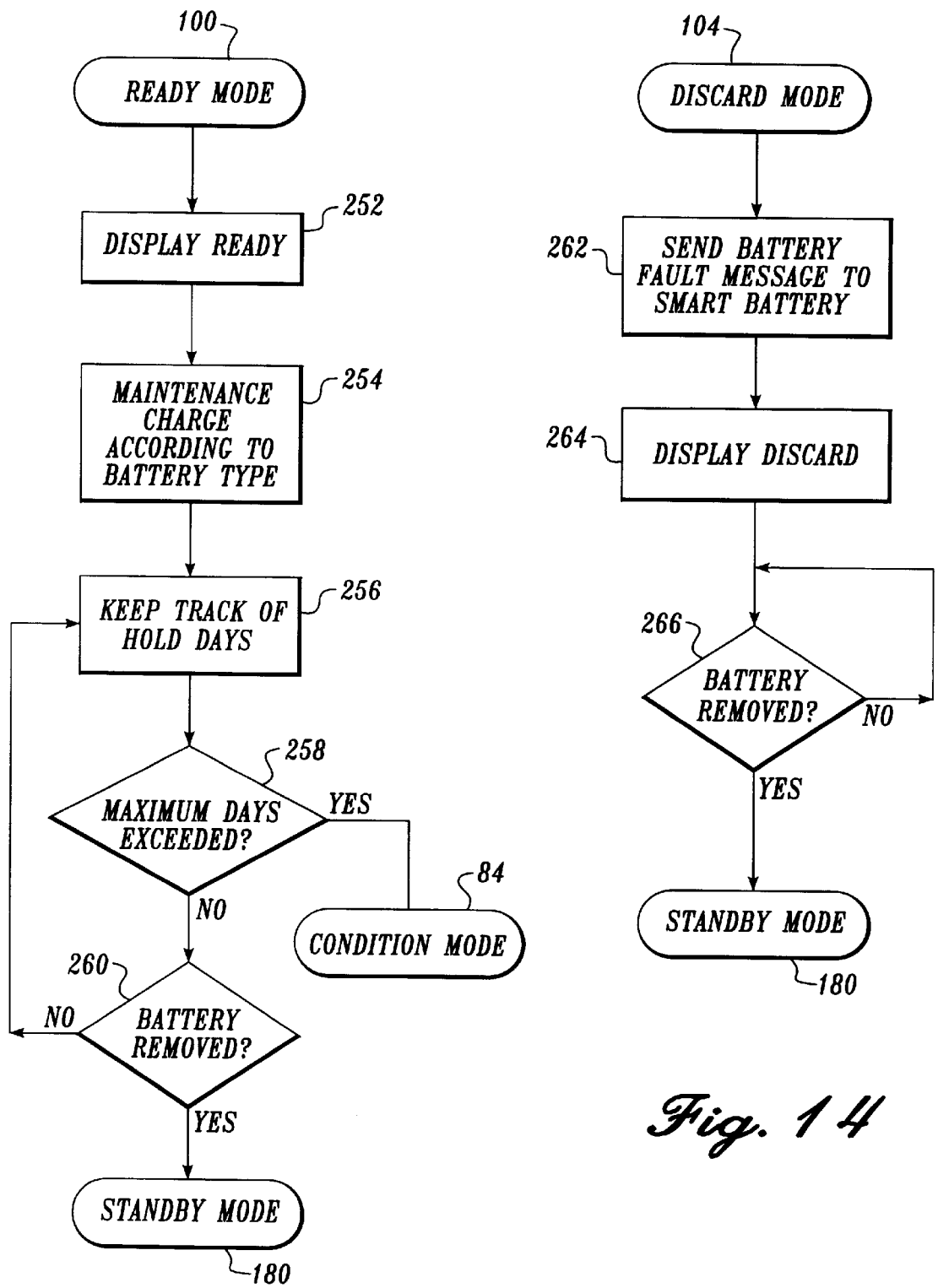
FIG. 13 is a flow diagram of a ready mode.
FIG. 14 is a flow diagram of a discard mode.

The ready mode 100 is illustrated in FIG. 13. Since the entry into the ready mode 100 means that the battery has been successfully tested, reconditioned, and charged, the battery maintenance and testing system 22 displays in a block 252 the fourth indicator 98 on the indictor and user interface panel 43. While the battery stays in the battery maintenance well 38, the battery maintenance and testing system 22 maintains the battery's full state of charge by applying a maintenance charge consistent with its battery type in a block 254. The battery maintenance and testing system 22 also keeps track in a block 256 of the number of days that the battery has remained inserted in the battery maintenance well 38. After a maximum number of days in the battery maintenance well 38 determined in a block 258, the battery maintenance well 38 is transitioned to the conditioning mode 84 where it is reconditioned, tested, and then recharged. When the battery maintenance and testing system 22 detects in a block 260 that the battery has been removed from the battery maintenance well 38, it returns to the standby mode 180.

The discard mode 104 is illustrated in FIG. 14. If the smart battery 24 fails in any other mode, it sends a battery fault message to the smart battery 24 on the bi-directional communication bus 26 in a block 262. It then displays the fifth indicator 102 on the battery maintenance and testing system 22 in a block 264. The battery maintenance and testing system 22 then waits for the battery to be removed in a block 266. When the battery is removed, the battery maintenance and testing system 22 transitions to the standby mode 180.

It should be appreciated from the foregoing that the operation of each battery maintenance well 38 is independent from the operation of the other two.

While the preferred embodiment of the invention has been illustrated and described, it will be appreciated that various changes can be made therein without departing from the spirit and scope of the invention. Accordingly, it is not intended that the scope of the invention be embodiments described above. Instead, the invention should be determined entirely by reference to the claims that follow.

The embodiments of the invention in which an exclusive property or privilege is claimed are defined as follows:

1. A method for maintaining and testing a rechargeable battery, the method comprising:
   (a) determining if the rechargeable battery is a smart battery or a dumb battery by detecting the presence of at least one communication signal and at least one temperature dependent signal from the rechargeable battery; and
   (b) performing at least one battery maintenance and testing routine on the rechargeable battery based upon whether the rechargeable battery is a smart battery or a dumb battery.

2. The method of claim 1, wherein performing the at least one battery maintenance and testing routine comprises charging the rechargeable battery in accordance with a charging algorithm based upon a chemistry of the rechargeable battery.

3. The method of claim 2, wherein if the rechargeable battery is a smart battery, the chemistry of the rechargeable battery is obtained from the rechargeable battery, and wherein if the rechargeable battery is a dumb battery the chemistry of the rechargeable battery is set to a default chemistry.

4. The method of claim 1, further indicating that the rechargeable battery should be discarded, if the at least one battery maintenance and testing routine fails.

5. The method of claim 4, wherein indicating that the rechargeable battery should be discarded comprises:
(a) issuing a battery fault indicator; and
(b) sending a battery fault message to the rechargeable battery, if the rechargeable battery is a smart battery.

6. The method of claim 1, further comprising maintaining the rechargeable battery in operating condition if the at least one battery maintenance and testing routine is successful.

7. The method of claim 6, wherein maintaining the rechargeable battery in operating condition comprises:
(a) applying a maintenance charge to the rechargeable battery; and
(b) after a maximum charge maintenance period, conditioning the rechargeable battery.

8. The method of claim 7, wherein the maintenance charge is applied to the rechargeable battery based upon a chemistry of the rechargeable battery.

9. The method of claim 8, wherein if the rechargeable battery is a smart battery, the chemistry of the rechargeable battery is obtained from the rechargeable battery, and wherein if the rechargeable battery is a dumb battery the chemistry of the rechargeable battery is set to a default chemistry.

10. A method for maintaining and testing a rechargeable battery, the method comprising:
(a) determining if the rechargeable battery is a smart battery or a dumb battery; and
(b) performing at least one battery maintenance and testing routine on the rechargeable battery based upon whether the rechargeable battery is a smart battery or a dumb battery, wherein the at least one battery maintenance and testing routine comprises conditioning the rechargeable battery by:
(i) charging the rechargeable battery;
(ii) performing a pulse discharge test on the rechargeable battery to determine if the rechargeable battery is capable of delivering a sufficient high current pulse; and
(iii) if the rechargeable battery is capable of delivering a sufficient high current pulse, discharging the rechargeable battery and recharging the rechargeable battery.

11. The method of claim 10, wherein the rechargeable battery is conditioned based upon a chemistry of the rechargeable battery.

12. The method of claim 11, wherein if the rechargeable battery is a smart battery, the chemistry of the rechargeable battery is obtained from the rechargeable battery, and wherein if the rechargeable battery is a dumb battery the chemistry of the rechargeable battery is set to a default chemistry.

13. The method of claim 10, wherein the pulse discharge test determines if the rechargeable battery is capable of delivering a sufficient high current pulse by:
(a) drawing a high current, short duration pulse from the rechargeable battery;
(b) measuring the voltage of the rechargeable battery during the high current, short duration pulse; and
(b) determining if the measured voltage remains above a predetermined minimum voltage threshold.

14. The method of claim 13, wherein the high current, short duration pulse is drawn from the rechargeable battery at a plurality of pulse discharge intervals.

15. The method of claim 13, wherein the measured voltage is determined to remain above a predetermined minimum voltage threshold if the measured voltage does not fall below the predetermined minimum voltage threshold during a maximum pulse discharge interval.

16. The method of claim 15, wherein the maximum pulse discharge interval is a pulse discharge interval during which a charge capacity of the rechargeable battery is expected to be between an upper percentage of a nominal capacity and a lower percentage of a nominal capacity.

17. The method of claim 15, wherein a pulse discharge interval is based upon an amount of current that would discharge a full capacity battery during a particular time interval.

18. A method for maintaining and testing a rechargeable battery, the method comprising:
(a) determining if the rechargeable battery is a smart battery or a dumb battery;
(b) performing at least one battery maintenance and testing routine on the rechargeable battery based upon whether the rechargeable battery is a smart battery or a dumb battery, wherein the at least one battery maintenance and testing routine determines if the rechargeable battery is excessively self-discharging by:
(i) discharging the rechargeable battery;
(ii) during discharge of the rechargeable battery, measuring an actual delivered charge capacity of the rechargeable battery; and
(iii) determining if the actual delivered charge capacity is less than a minimum target capacity.

19. The method of claim 18, wherein determining if the rechargeable battery is excessively self-discharging further comprises:
(a) charging the rechargeable battery to fill capacity; and
(b) storing the rechargeable battery open-circuited for a predetermined period of time.

20. The method of claim 19, wherein the rechargeable battery is discharged and charged based upon a chemistry of the rechargeable battery.

21. The method of claim 20, wherein if the rechargeable battery is a smart battery, the chemistry of the rechargeable battery is obtained from the rechargeable battery, and wherein if the rechargeable battery is a dumb battery the chemistry of the rechargeable battery is set to a default chemistry.

22. The method of claim 18, wherein determining if the rechargeable battery is excessively self-discharging further comprises obtaining an excessive self-discharge report from the rechargeable battery, if the rechargeable battery is a smart battery.

23. An apparatus for maintaining and testing a rechargeable battery, the apparatus comprising:
(a) at least one battery well for receiving a rechargeable battery for maintenance and testing;
(b) a charging and discharging unit for discharging and charging the rechargeable battery received by the at least one battery well;
(c) a first non-volatile memory for storing program instructions for maintaining and testing the rechargeable battery; and
(d) a processing unit coupled to the at least one battery well via a communication bus, the charging and discharging unit, and the first non-volatile memory, wherein the processing unit executes the program instructions which maintain and test the rechargeable battery by:
 (i) determining if the rechargeable battery is a smart battery or a dumb battery; and
 (ii) implementing at least one of a plurality of maintenance and testing modes which cause the charging and discharging unit to charge and recharge the rechargeable battery in a manner so as to maintain and test the condition of the rechargeable battery while in the at least one battery well, wherein the maintenance and testing modes are implemented based upon whether the rechargeable battery is a smart battery or a dumb battery.

24. The apparatus of claim 23, wherein the processing unit determines that the rechargeable battery is a smart battery if the processing unit detects that the presence of at least one communication signal on the communication bus and at least one temperature-dependent signal on the rechargeable battery.

25. The apparatus of claim 23, wherein the at least one maintenance and testing mode implemented by the processing unit is a charging mode which causes the discharging and charging unit to charge the rechargeable battery in accordance with a charging algorithm based upon a chemistry of the rechargeable battery.

26. The apparatus of claim 25, wherein if the rechargeable battery is a smart battery, the processing unit obtains the chemistry of the rechargeable battery from the rechargeable battery via the communication bus; and wherein if the rechargeable battery is a dumb battery the processing unit sets the chemistry of the rechargeable battery to a default chemistry.

27. The apparatus of claim 23, wherein the processing unit implements a discard mode which indicates that the rechargeable battery should be discarded, if any of the maintenance and testing modes implemented by the processing unit fails.

28. The apparatus of claim 27, wherein the discard mode indicates that the rechargeable battery should be discarded by:
 (a) causing the processing unit to issue battery fault indicator; and
 (b) causing the processing unit to send a battery fault message to the rechargeable battery via the communication bus, if the rechargeable battery is a smart battery.

29. The apparatus of claim 23, wherein the processing unit implements a ready mode which maintains the rechargeable battery in operating condition if the at least one other mode is successful.

30. The apparatus of claim 29, wherein the ready mode maintains the rechargeable battery in operating condition by:
 (a) causing the charging and discharging unit to apply a maintenance charge to the rechargeable battery; and
 (b) after a maximum charge maintenance period, causing the processing unit to implement a conditioning mode which conditions the rechargeable battery.

31. The apparatus of claim 30, wherein the charging and discharging unit applies the maintenance charge to the rechargeable battery based upon a chemistry of the rechargeable battery.

32. The apparatus of claim 31, wherein if the rechargeable battery is a smart battery, the processing unit obtains the chemistry of the rechargeable battery from the rechargeable battery, and wherein if the rechargeable battery is a dumb battery the processing unit sets the chemistry of the rechargeable battery to a default chemistry.

33. The apparatus of claim 23, wherein the processing unit implements at least one of the maintenance and testing modes upon expiration of a predetermined time interval.

34. The apparatus of claim 23, wherein the processing unit implements at least one of the maintenance and testing modes in response to user input from a user display and interface coupled to the processing unit.

35. The apparatus of claim 23, wherein the processing unit implements at least one of the maintenance and testing modes if the rechargeable battery is a smart battery and a maintenance flag is set in the rechargeable battery.

36. An apparatus for maintaining and testing a rechargeable battery, the apparatus comprising:
 (a) at least one battery well for receiving a rechargeable battery for maintenance and testing;
 (b) a charging and discharging unit for discharging and charging the rechargeable battery received by the at least one battery well;
 (c) a first non-volatile memory for storing program instructions for maintaining and testing the rechargeable battery; and
 (d) a processing unit coupled via a communication bus to the at least one battery well, the charging and discharging unit, and the first non-volatile memory, wherein the processing unit executes the program instructions which maintain and test the rechargeable battery by:
  (i) determining if the rechargeable battery is a smart battery or a dumb battery; and
  (ii) implementing at least one of a plurality of maintenance and testing modes which cause the charging and discharging unit to charge and recharge the rechargeable battery in a manner so as to maintain and test the condition of the rechargeable battery while in the at least one battery well, wherein the at least one maintenance and testing mode is a conditioning mode which conditions the rechargeable battery by:
   (A) causing the charging and discharging unit to charge the rechargeable battery;
   (B) performing a pulse discharge test on the rechargeable battery to determine if the rechargeable battery is capable of delivering a sufficient high current pulse; and
   (C) if the rechargeable battery is capable of delivering a sufficient high current pulse, causing the charging and discharging unit to discharge the rechargeable battery and recharge the rechargeable battery.

37. The apparatus of claim 36, wherein the conditioning mode conditions the rechargeable battery based upon a chemistry of the rechargeable battery.

38. The apparatus of claim 37, wherein if the rechargeable battery is a smart battery, the processing unit obtains the chemistry of the rechargeable battery from the rechargeable battery via the communication bus, and wherein if the rechargeable battery is a dumb battery the processing unit sets the chemistry of the rechargeable battery to a default chemistry.

39. The apparatus of claim 36, wherein the pulse discharge test determines if the rechargeable battery is capable of delivering a sufficient high current pulse by:
 (a) causing the charging and discharging unit to draw a high current, short duration pulse from the rechargeable battery;
 (b) measuring the voltage of the rechargeable battery during the high current, short duration pulse; and
 (b) determining if the measured voltage remains above a predetermined minimum voltage threshold.

40. The apparatus of claim 39, wherein the charging and discharging unit draws the high current, short duration pulse from the rechargeable battery at a plurality of pulse discharge intervals.

41. The apparatus of claim 39, wherein the measured voltage is determined to remain above a predetermined minimum voltage threshold if the measured voltage does not fall below the predetermined minimum voltage threshold during a maximum pulse discharge interval.

42. The apparatus of claim 41, wherein the maximum pulse discharge interval is a pulse discharge interval during which a charge capacity of the rechargeable battery is expected to be between an upper percentage of a nominal capacity and a lower percentage of a nominal capacity.

43. The apparatus of claim 42, wherein a pulse discharge interval is based upon an amount of current that would discharge a full capacity battery during a particular time interval.

44. The apparatus of claim 36, wherein after the charging and discharging unit discharges and recharges the rechargeable battery during the condition mode, the processing unit implements a ready mode which maintains the rechargeable battery in operating condition.

45. The apparatus of claim 36, wherein if the rechargeable battery is not capable of delivering a sufficient high current pulse, the processing unit implements a discard mode which indicates that the rechargeable battery should be discarded.

46. An apparatus for maintaining and testing a rechargeable battery, the apparatus comprising:
　(a) at least one battery well for receiving a rechargeable battery for maintenance and testing;
　(b) a charging and discharging unit for discharging and charging the rechargeable battery received by the at least one battery well;
　(c) a first non-volatile memory for storing program instructions for maintaining and testing the rechargeable battery; and
　(d) a processing unit coupled via a communication bus to the at least one battery well, the charging and discharging unit, and the first non-volatile memory, wherein the processing unit executes the program instructions which maintain and test the rechargeable battery by:
　　(i) determining if the rechargeable battery is a smart battery or a dumb battery; and
　　(ii) implementing at least one of a plurality of maintenance and testing modes which cause the charging and discharging unit to charge and recharge the rechargeable battery in a manner so as to maintain and test the condition of the rechargeable battery while in the at least one battery well, wherein the at least one maintenance and testing mode is a conditioning mode which conditions the rechargeable battery by:
　　if the rechargeable battery is a dumb battery,
　　　(A) causing the charging and discharging unit to discharge the rechargeable battery;
　　　(B) during discharge of the rechargeable battery, measuring an actual delivered charge capacity of the rechargeable battery; and
　　　(C) determining if the actual delivered charge capacity is less than a minimum target capacity.

47. The apparatus of claim 46, wherein the shelf-life mode further determines if the rechargeable battery is excessively self-discharging by:
　if the rechargeable battery is a dumb battery,
　(a) causing the charging and discharging unit to charge the rechargeable battery to full capacity; and
　(b) requiring that the rechargeable battery open-circuited be stored in the at least one battery well for a predetermined period of time.

48. The apparatus of claim 47, wherein the shelf-life mode causes the charging and discharging unit to discharge and charge the rechargeable battery based upon a chemistry of the rechargeable battery.

49. The apparatus of claim 48, wherein if the rechargeable battery is a smart battery, the processing unit obtains the chemistry of the rechargeable battery from the rechargeable battery via the communication bus, and wherein if the rechargeable battery is a dumb battery the processing unit sets the chemistry of the rechargeable battery to a default chemistry.

50. The apparatus of claim 46, wherein if the actual delivered charge capacity is less than the minimum target capacity, the processing unit implements a discard mode which indicates that the rechargeable battery should be discarded.

51. The apparatus of claim 46, wherein the shelf-life mode determines if the rechargeable battery is excessively self-discharging by causing the processing unit to obtain an excessive self-discharge report from the rechargeable battery via the communication bus if the rechargeable battery is a smart battery.

52. The apparatus of claim 51, wherein if the processing unit obtains an excessive self-discharge report from the rechargeable battery, the processing unit implements a discard mode which indicates that the rechargeable battery should be discarded.

53. The apparatus of claim 51, wherein if the rechargeable battery is not excessively self-discharging, the processing unit implements a ready mode which maintains the rechargeable battery in operating condition.

54. A rechargeable battery maintenance and testing system for conditioning, testing and charging a rechargeable battery, the system comprising:
　(a) a stand-by mode for determining if the rechargeable battery is a smart battery or a dumb battery;
　(b) a conditioning mode for conditioning the rechargeable battery;
　(c) a charging mode which charges the rechargeable battery; and
　(d) a shelf-life mode which determines if the rechargeable battery is excessively self-discharging, wherein implementation of the conditioning mode, the charging mode and the shelf-life mode depends upon whether the rechargeable battery is a dumb battery or a smart battery.

55. The system of claim 54, wherein the stand-by mode determines if the rechargeable battery is a smart battery by determining if the rechargeable battery has communication ability.

56. The system of claim 55, wherein if the rechargeable battery has communication ability, the stand-by mode obtains a battery type, a state of charge, a conditioning flag and a fault flag from the rechargeable battery, and wherein if the rechargeable battery does not have communication ability, the stand-by mode sets the battery type to a default type.

57. The system of claim 56, wherein the conditioning conditions the rechargeable battery by:
　(a) charging the rechargeable battery according to the battery type;
　(b) performing a pulse discharge test on the rechargeable battery to determine if the rechargeable battery needs to be discarded; and
　(c) if the rechargeable battery does not need to be discarded, discharging the rechargeable battery and recharging the rechargeable battery according to the battery type.

58. The system of claim 57, wherein the pulse discharge test determines if the rechargeable battery needs to be discarded by:

(a) performing at least one pulse discharge of the rechargeable battery;

(b) measuring the voltage of the rechargeable battery during the pulse discharge; and (c) determining if the measured voltage remains above a predefined end discharge voltage for a predetermined maximum pulse discharge interval.

59. The system of claim 58, wherein a plurality of pulse discharges of the rechargeable battery are performed.

60. The system of claim 59, wherein the maximum pulse discharge interval is based upon an amount of current that would discharge a full capacity battery during a particular time interval.

61. The system of claim 57, wherein after the conditioning mode discharges and recharges the rechargeable battery, the conditioning mode transitions to a ready mode which maintains the rechargeable battery in operating condition.

62. The system of claim 57, wherein if the conditioning modes determines that the rechargeable battery needs to be discarded, the conditioning mode transitions to a discard mode which indicates that the rechargeable battery should be discarded.

63. The system of claim 56, wherein the charging mode charges the rechargeable battery in accordance with a charging algorithm based upon the battery type of the rechargeable battery.

64. The system of claim 56, wherein the shelf-life mode determines if the rechargeable battery is excessively self-discharging by:

if the rechargeable battery is a dumb battery,
(a) discharging the rechargeable battery according to the battery type of the rechargeable battery;
(b) during discharge of the rechargeable battery, measuring an actual delivered charge capacity of the rechargeable battery; and
(c) determining if the actual delivered charge capacity is less than a minimum target capacity.

65. The system of claim 64, wherein if the actual delivered charge capacity is less than the minimum target capacity, the shelf-life mode transitions to a discard mode which indicates that the rechargeable battery should be discarded.

66. The system of claim 64, wherein the shelf-life mode determines if the rechargeable battery is excessively self-discharging from the state of charge obtained from the rechargeable battery, if the rechargeable battery is a smart battery.

67. The system of claim 66, wherein if the shelf-life mode obtains determines if the rechargeable battery is excessively self-discharging from the state of charge, the shelf-life mode transitions to a discard mode which indicates that the rechargeable battery should be discarded.

68. The system of claim 67, wherein if the rechargeable battery is not excessively self-discharging, the shelf-life mode transitions to a ready mode which maintains the rechargeable battery in operating condition.

69. The system of claim 54, further comprising a discard mode which indicates that the rechargeable battery should be discarded, wherein the discard mode is entered if any one of the stand-by mode, conditioning mode, charging mode and shelf-life mode fails.

70. The system of claim 69, wherein the discard mode indicates that the rechargeable battery should be discarded by:

(a) issuing a battery fault indicator; and (b) sending a battery fault message to the rechargeable battery, if the rechargeable battery is a smart battery.

71. The system of claim 54, further comprising a ready mode which maintains the rechargeable battery in operating condition, wherein the ready mode is entered if any of the conditioning mode, charging mode and shelf-life mode are successful.

72. The system of claim 71, wherein the ready mode maintains the rechargeable battery in operating condition by:

(a) applying a maintenance charge to the rechargeable battery in accordance with the battery type of the rechargeable battery; and (b) after a maximum charge maintenance period, entering the conditioning mode which conditions the rechargeable battery.

73. The system of claim 54, wherein the system transitions between the stand-by mode, the conditioning mode, the charging mode, and the shelf-life mode upon expiration of a predetermined time interval.

74. The system of claim 54, wherein the system transitions between the stand-by mode, the conditioning mode, the charging mode, and the shelf-life mode in response to user input.

75. The system of claim 54, wherein the system transitions between the stand-by mode, the conditioning mode, the charging mode, and the shelf-life mode in response to a maintenance flag on the rechargeable battery, if the rechargeable battery is a smart battery.

76. A method of conditioning a rechargeable battery comprising:

(a) charging the rechargeable battery;

(b) performing a pulse discharge test on the rechargeable battery to determine if the rechargeable battery is capable of delivering a sufficient high current pulse; and (c) if the rechargeable battery is capable of delivering a sufficient high current pulse, discharging the rechargeable battery and recharging the rechargeable battery.

77. The method of claim 76, wherein the pulse discharge test determines if the rechargeable battery is capable of delivering a sufficient high current pulse by:

(a) drawing a high current, short duration pulse from the rechargeable battery;

(b) measuring the voltage of the rechargeable battery during the high current, short duration pulse; and (c) determining if the measured voltage remains above a predetermined minimum voltage threshold.

78. The method of claim 76, wherein the high current, short duration pulse is drawn from the rechargeable battery at a plurality of pulse discharge intervals.

79. The method of claim 77, wherein the measured voltage is determined to remain above a predetermined minimum voltage threshold if the measured voltage does not fall below the predetermined minimum voltage threshold during a maximum pulse discharge interval.

80. The method of claim 79, wherein the maximum pulse discharge interval is a pulse discharge interval during which a charge capacity of the rechargeable battery is expected to be between an upper percentage of a nominal capacity and lower percentage of a nominal capacity.

81. The method of claim 79, wherein a pulse discharge interval is based upon an amount of current that would discharge a full capacity battery during a particular time interval.

* * * * *

UNITED STATES PATENT AND TRADEMARK OFFICE
CERTIFICATE OF CORRECTION

PATENT NO. : 6,137,261
DATED : October 24, 2000
INVENTOR(S) : W.D. Kurle et al.

It is certified that error appears in the above-identified patent and that said Letters Patent is hereby corrected as shown below:

| COLUMN | LINE | |
|---|---|---|
| [56] Pg. 1, col. 2 | Refs. Cited (Foreign Pats., Item 4) | "9-271144" should read --9-271144A-- |
| 15 (Claim 13, | 66 line 8) | "(b)" should read --(c)-- |
| 16 (Claim 18, | 21 line 4) | "battery;" should read --battery; and-- |
| 17 (Claim 24, | 17 line 3) | "detects that the" should read --detects the-- |
| 17 (Claim 28, | 42 line 4) | "issue battery fault" should read --issue a battery fault-- |
| 18 (Claim 39, | 66 line 9) | "(b)" should read --(c)-- |

UNITED STATES PATENT AND TRADEMARK OFFICE
CERTIFICATE OF CORRECTION

PATENT NO.   :  6,137,261
DATED        :  October 24, 2000
INVENTOR(S)  :  W.D. Kurle et al.

It is certified that error appears in the above-identified patent and that said Letters Patent is hereby corrected as shown below:

COLUMN     LINE

21             20          "modes" should read --mode--
(Claim 62,     line 2)

21             52          "obtains determines" should read --determines--
(Claim 67,     line 2)

Signed and Sealed this

Twenty-fourth Day of April, 2001

Attest:

NICHOLAS P. GODICI

Attesting Officer    Acting Director of the United States Patent and Trademark Office